United States Patent
Zhou et al.

(10) Patent No.: US 12,118,948 B2
(45) Date of Patent: Oct. 15, 2024

(54) GATE DRIVE CIRCUIT, DISPLAY PANEL, AND DISPLAY APPARATUS

(71) Applicant: Xiamen Tianma Display Technology Co., Ltd., Xiamen (CN)

(72) Inventors: Zhiwei Zhou, Xiamen (CN); Wenxin Lin, Xiamen (CN)

(73) Assignee: Xiamen Tianma Display Technology Co., Ltd., Xiamen (CN)

( * ) Notice: Subject to any disclaimer, the term of this patent is extended or adjusted under 35 U.S.C. 154(b) by 0 days.

(21) Appl. No.: 18/212,896

(22) Filed: Jun. 22, 2023

(65) Prior Publication Data

US 2024/0304151 A1 Sep. 12, 2024

(30) Foreign Application Priority Data

Mar. 10, 2023 (CN) .......................... 202310231293.3

(51) Int. Cl.
*G09G 3/3266* (2016.01)
*G11C 19/28* (2006.01)

(52) U.S. Cl.
CPC ........... *G09G 3/3266* (2013.01); *G11C 19/28* (2013.01); *G09G 2310/0286* (2013.01)

(58) Field of Classification Search
CPC ......... G09G 3/3266; G09G 2310/0286; G11C 19/28
See application file for complete search history.

(56) References Cited

U.S. PATENT DOCUMENTS

| | | | |
|---|---|---|---|
| 2004/0061693 A1* | 4/2004 | Noguchi .............. | G09G 3/3275 345/204 |
| 2007/0127620 A1* | 6/2007 | Moon ................... | G11C 19/28 377/64 |
| 2011/0199363 A1* | 8/2011 | Lee ....................... | G09G 3/3677 345/212 |

FOREIGN PATENT DOCUMENTS

CN 103198867 A 7/2013

* cited by examiner

*Primary Examiner* — Stephen G Sherman
(74) *Attorney, Agent, or Firm* — Anova Law Group, PLLC

(57) ABSTRACT

A gate drive circuit, a display panel and a display apparatus are provided in the present disclosure. The gate drive circuit includes a quantity n of shift register units arranged along a first direction. A shift register unit includes an input circuit, a first node control circuit, a second node control circuit and an output control circuit. The first node control circuit is configured to control a stage of a first node; and the second node control circuit is configured to control a stage of a second node. The output control circuit is configured to control the scan signal output terminal to output a scan signal. Control terminals of an input circuit of an m-th shift register unit are electrically connected to scan signal output terminals of an (m+1)-th shift register unit and an (m−1)-th shift register unit respectively, where m∈n.

17 Claims, 21 Drawing Sheets

GATE DRIVE CIRCUIT, DISPLAY PANEL, AND DISPLAY APPARATUS

CROSS-REFERENCE TO RELATED APPLICATION

The present disclosure claims the priority of Chinese Patent Application No. 202310231293.3, filed on Mar. 10, 2023, the content of which is incorporated herein by reference in its entirety.

TECHNICAL FIELD

The present disclosure generally relates to the field of display technology and, more particularly, relates to a gate drive circuit, a display panel, and a display apparatus.

BACKGROUND

With the development of science and technology, display panels are constantly evolving. Currently, active-matrix organic light-emitting diodes (AMOLED) are gradually becoming mainstream. When the AMOLED display panel is in operation, the drive control of a source drive circuit, a gate drive circuit and a light-emitting drive circuit may be required to ensure normal light-emitting of light-emitting pixels.

SUMMARY

One aspect of the present disclosure provides a gate drive circuit. The gate drive circuit includes a quantity n of shift register units arranged along a first direction. A shift register unit includes an input circuit, a first node control circuit, a second node control circuit and an output control circuit, where each of the input circuit, the first node control circuit and the second node control circuit is electrically connected to a third node; the first node control circuit is configured to control a stage of a first node; the second node control circuit is configured to control a stage of a second node; the output control circuit is electrically connected to each of a scan signal output terminal, the first node and the second node, and configured to control the scan signal output terminal to output a scan signal according to the stage of the first node and the stage of the second node. Along the first direction, control terminals of an input circuit of an m-th shift register unit are electrically connected to a scan signal output terminal of an (m+1)-th shift register unit and a scan signal output terminal of an (m−1)-th shift register unit respectively, where m∈n.

Another aspect of the present disclosure provides a display panel including a gate drive circuit. The gate drive circuit includes a quantity n of shift register units arranged along a first direction. A shift register unit includes an input circuit, a first node control circuit, a second node control circuit and an output control circuit, where each of the input circuit, the first node control circuit and the second node control circuit is electrically connected to a third node; the first node control circuit is configured to control a stage of a first node; the second node control circuit is configured to control a stage of a second node; the output control circuit is electrically connected to each of a scan signal output terminal, the first node and the second node, and configured to control the scan signal output terminal to output a scan signal according to the stage of the first node and the stage of the second node. Along the first direction, control terminals of an input circuit of an m-th shift register unit are electrically connected to a scan signal output terminal of an (m+1)-th shift register unit and a scan signal output terminal of an (m−1)-th shift register unit respectively, where m∈n.

Another aspect of the present disclosure provides a display apparatus. The display apparatus includes a display panel including a gate drive circuit. The gate drive circuit includes a quantity n of shift register units arranged along a first direction. A shift register unit includes an input circuit, a first node control circuit, a second node control circuit and an output control circuit, where each of the input circuit, the first node control circuit and the second node control circuit is electrically connected to a third node; the first node control circuit is configured to control a stage of a first node; the second node control circuit is configured to control a stage of a second node; the output control circuit is electrically connected to each of a scan signal output terminal, the first node and the second node, and configured to control the scan signal output terminal to output a scan signal according to the stage of the first node and the stage of the second node. Along the first direction, control terminals of an input circuit of an m-th shift register unit are electrically connected to a scan signal output terminal of an (m+1)-th shift register unit and a scan signal output terminal of an (m−1)-th shift register unit respectively, where m∈n.

Other aspects of the present disclosure may be understood by those skilled in the art in light of the description, the claims, and the drawings of the present disclosure.

BRIEF DESCRIPTION OF THE DRAWINGS

To clearly illustrate technical solutions in embodiments of the present disclosure, the drawings that need to be used in embodiments of the present disclosure are described briefly hereinafter. Obviously, the drawings in following description are only embodiments of the present disclosure, and those skilled in the art may also obtain other drawings according to the drawings without creative efforts.

DETAILED DESCRIPTION

Figure 1:
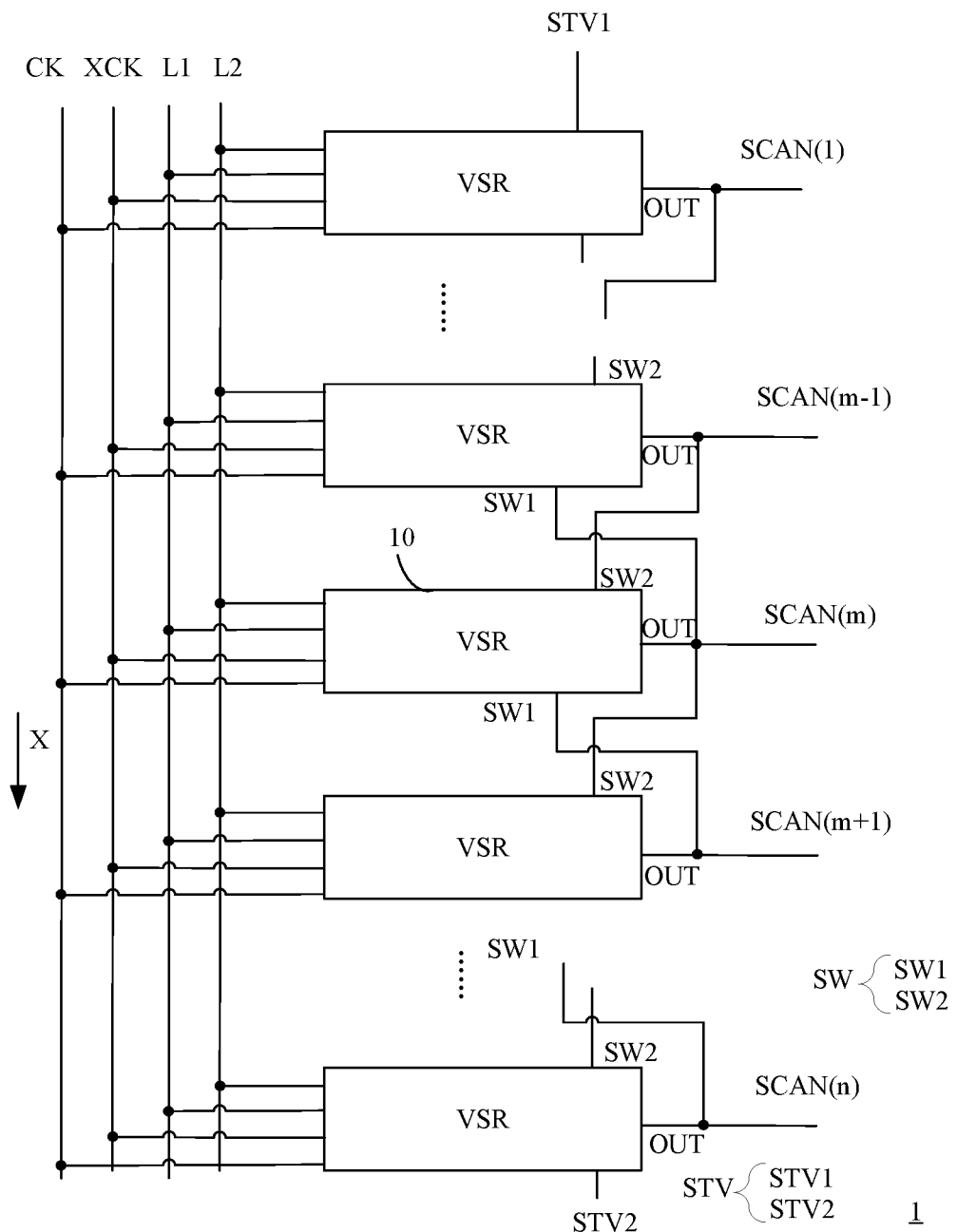
FIG. 1 illustrates an optional circuit structural schematic of a gate drive circuit according to various embodiments of the present disclosure.

The features and exemplary embodiments of various aspects of the present disclosure are described in detail hereinafter. In order to clearly illustrate the objectives, technical solutions and advantages of the present disclosure, the present disclosure is further described in detail below in conjunction with accompanying drawings and specific embodiments. It should be understood that specific embodiments described herein are only intended to explain the present disclosure rather than limit the present disclosure. It should be apparent to those skilled in the art that the present disclosure may be practiced without some of these specific details. Following description of embodiments is only to provide a better understanding of the present disclosure by showing examples of the present disclosure.

It should be noted that in the present disclosure, relational terms such as "first" and "second" may be only configured to distinguish one entity or operation from another entity or operation and may not necessarily require or imply that such actual relationship or order is between these entities or operations. Furthermore, the term "comprise", "include" or any other variation thereof may be intended to cover a non-exclusive inclusion. Therefore, a process, a method, an article or apparatus including a set of elements may include not only those elements, but also other elements not expressly listed, or also include elements inherent in the process, the method, the article or apparatus. Without further limitations, an element defined by the statement "include . . . " may not exclude the presence of additional identical elements in the process, the method, the article, or apparatus including such element.

It should be noted that, in the case of no conflict, embodiments in the present disclosure and the features in embodiments may be combined with each other. Embodiments are described in detail below in conjunction with accompanying drawings.

In order to realize normal light-emitting display, current display panels require cooperative control of various drive circuits. The drive circuit may include a gate drive circuit.

At present, the gate drive circuit in the existing technology may be mainly configured to output a scan signal to each sub-pixel in the display region. The gate drive circuit may include a plurality of shift register units. The gate drive circuit formed by the shift register units may have only one fixed stage transmission direction of the scan signal.

For example, a certain shift register unit close to the drive chip may be configured as a starting stage; and starting from the starting stage, the direction away from the drive chip may be configured as the fixed stage transmission direction of the scan signal. Furthermore, the shift register units may be controlled to output the scan signal to the sub-pixels in the display region stage-by-stage according to the fixed stage transmission direction.

For another embodiment, the gate drive circuit may also use a certain shift register unit along the direction away from the drive chip as the starting stage; and starting from the starting stage, the direction close to the drive chip may be configured as the fixed stage transmission direction of the scan signal. Furthermore, the shift register units may be controlled to output the scan signal to the sub-pixels in the display region stage-by-stage according to the fixed stage transmission direction.

For some special requirements, for example, the display panel is required to be able to display normally in both forward and reverse directions, which may require the display panel to be compatible with two different modes along the scan direction.

However, under the premise that the existing technology only configures a fixed stage transmission direction of the scan signal, the panel layout of the display panel may have been fixed, and relative position of the shift register units in the gate drive circuit may also be fixed, thereby being difficult for the gate drive circuit to support compatibility of forward and reverse direction scans.

As disclosed above, there is a need to provide a gate drive control solution which is compatible to multiple modes.

In order to solve above technical problems, embodiments of the present disclosure provide a gate drive circuit, a display panel and a display apparatus. According to embodiments of the present disclosure, the gate drive circuit is illustrated with reference to FIGS. 1-9 hereinafter.

Figure 2:
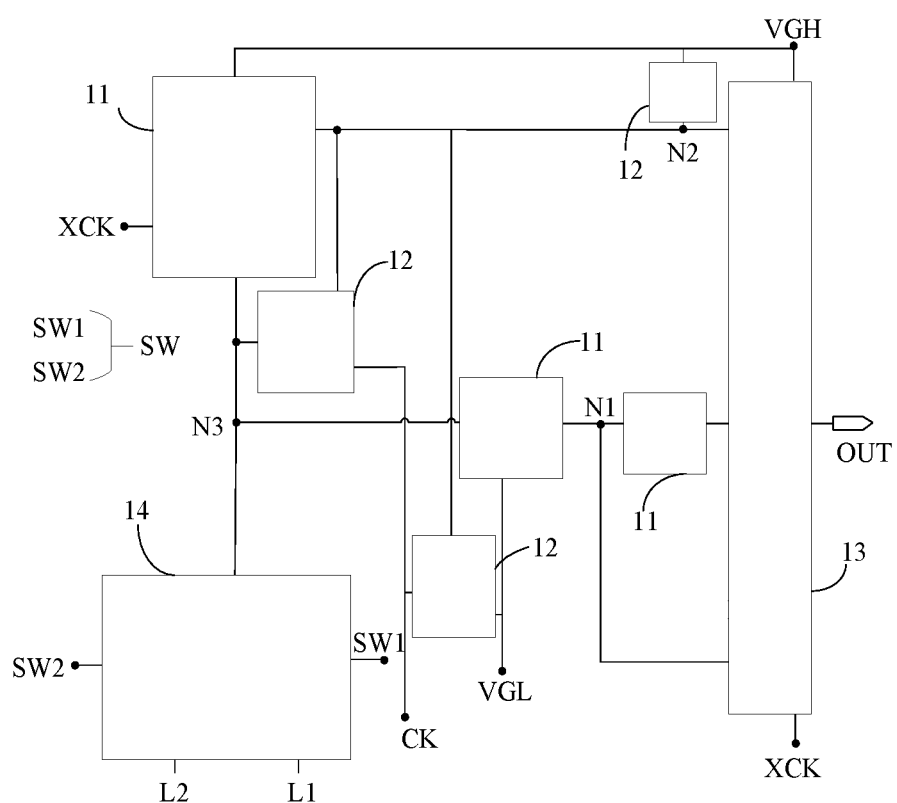
FIG. 2 illustrates an optional circuit structural schematic of a single shift register unit in a gate drive circuit according to various embodiments of the present disclosure.
Figure 3:
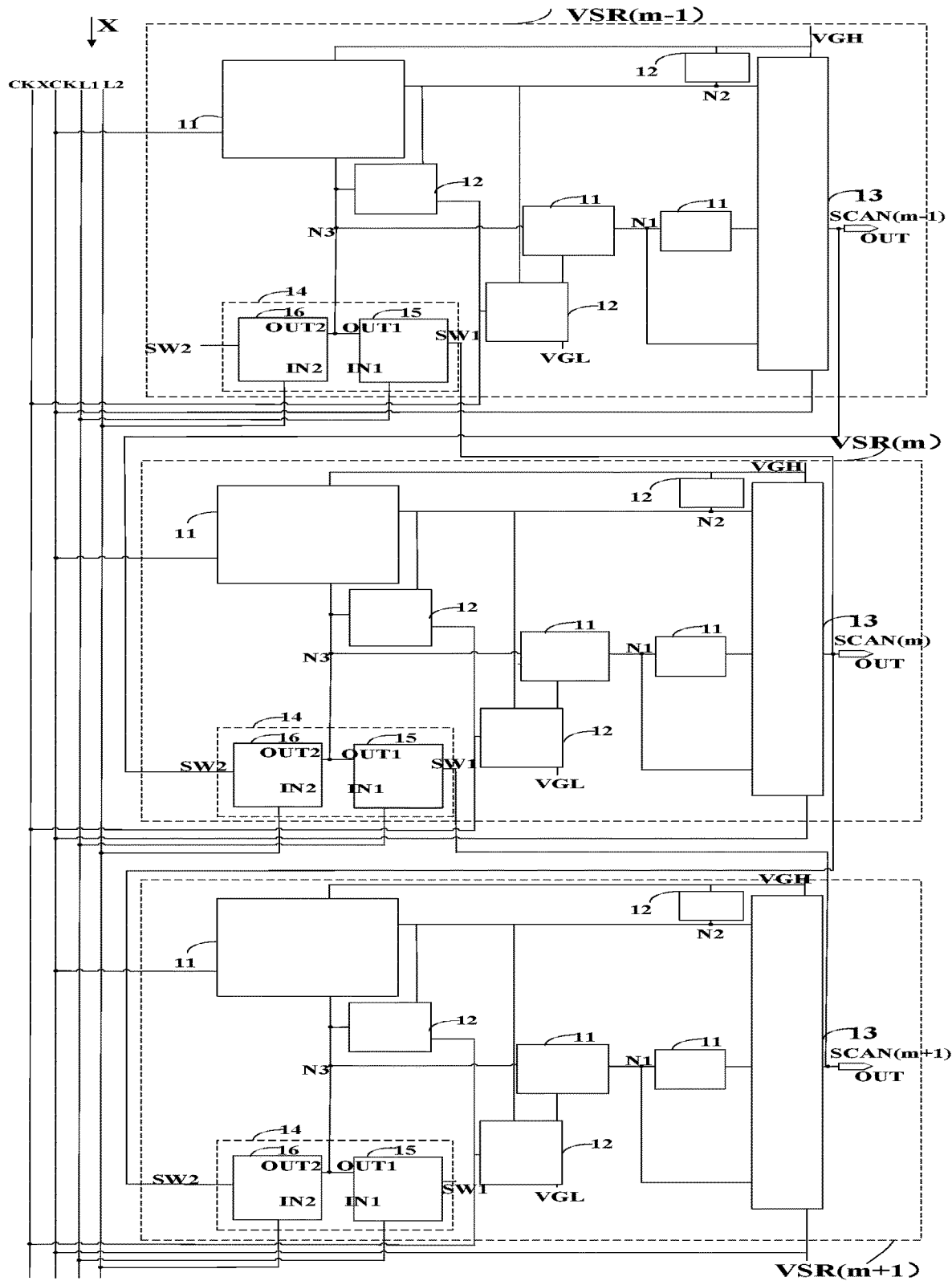
FIG. 3 illustrates an optional circuit structural schematic where three shift register units are cascaded in a gate drive circuit according to various embodiments of the present disclosure.

Referring to FIGS. 1-3, FIG. 1 illustrates an optional circuit structural schematic of the gate drive circuit according to various embodiments of the present disclosure; FIG. 2 illustrates an optional circuit structural schematic of a single shift register unit in FIG. 1; and FIG. 3 illustrates an optional circuit structural schematic where three shift register units are cascaded in a gate drive circuit in FIG. 1.

Referring to FIG. 1, a gate drive circuit 1 may include a quantity n of shift register units 10 arranged along the first direction X, where n may be a positive integer. Above-mentioned first direction X may be a direction intersecting scan signal lines in the display panel. For example, the first direction X may be a direction perpendicular to the scan signal lines.

It should be noted that, the direction from the side away from the drive chip of the display panel to the side close to the drive chip of the display panel is the first direction X, which may be taken as an example in embodiment of the present disclosure. The first direction may be same as the stage transmission direction of the scan signal SCAN when the shift register units 10 work in the forward direction scan mode. Correspondingly, the first shift register unit 10 arranged along the first direction X may have the farthest distance to the driver chip, and the n-th shift register unit may have the shortest distance to the driver chip.

Referring to FIGS. 1-3, the shift register unit 10 may include an input circuit 14, a first node control circuit 11, a second node control circuit 12, and an output control circuit 13.

The input circuit 14, the first node control circuit 11 and the second node control circuit 12 may be all electrically connected to the third node N3.

The first node control circuit 11 may be configured to control the stage of the first node N1, and the second node control circuit 12 may be configured to control the stage of the second node N2.

The output control circuit 13 may be electrically connected to a scan signal output terminal OUT, the first node N1 and the second node N2. The output control circuit 13 may control the scan signal output terminal OUT to output the scan signal SCAN according to the stage of the first node N1 and the stage of the second node N2. The scan signal SCAN may provide a control signal for the pixel circuit.

Along the first direction X, a control terminal SW of the input circuit 14 of the m-th shift register unit 10 may be respectively connected to the scan signal output terminal OUT of the (m+1)-th shift register unit 10 and the scan signal output terminal OUT of the (m−1)-th shift register unit 10, where m∈n.

In embodiment of the present disclosure, the quantity n of shift register units 10 may be configured to be arranged along the first direction X in the gate drive circuit 1; the shift register unit 10 may include the input circuit 14, the first node control circuit 11, the second node control circuit 12 and the output control circuit 13; and the input circuit 14, the first node control circuit 11 and the second node control circuit 12 may be all electrically connected to the third node N3. In addition, along the first direction X, the control terminal SW of the input circuit 14 of the m-th shift register unit 10 may be respectively connected to the scan signal output terminal OUT of the (m+1)-th shift register unit 10 and the scan signal output terminal OUT of the (m−1)-th shift register unit 10, where m∈n. Therefore, by configuring the input circuit 14 in a single shift register unit 10 to be connected to the scan signal output terminals OUT of two adjacent shift register units 10, the input circuit 14 of the single shift register unit 10 may simultaneously receive signal control of the scan signal output terminals OUT of two adjacent shift register units 10 along the first direction X. Furthermore, after the input circuit 14 of the gate drive circuit 1 receives a signal, the plurality of shift register units 10 may have two fixed stage transmission directions of the scan signal, which may be compatible with the forward direction scan mode and the reverse direction scan mode. In such way, the gate drive control solution with at least two modes may be provided, which may be suitable for various requirements and improve the compatibility of the display panel.

In one embodiment, the quantity n of shift register units 10 may be greater than the quantity of pixel rows in the display panel.

It should be noted that, since the gate drive control solution applicable to the forward direction scan mode and the reverse direction scan mode is needed in embodiment of the present disclosure, each shift register unit 10 along the first direction X may require to be cooperated with two adjacent shift register units 10. In order to ensure that the gate drive circuit 1 normally outputs the scan signal SCAN to each sub-pixel, several more stages of shift register units 10 may be configured compared to the quantity of pixel rows, thereby being ensured that the gate drive circuit 1 stably outputs the scan signal SCAN to each sub-pixel.

In addition, considering the case that there may be virtual pixel rows in the display region and idle transfer of the shift register unit 10 in the gate drive circuit 1 (the idle transfer indicates that the scan signal outputted from the shift register unit 10 may not be transmitted to the pixel circuit, but only transmitted to next stage shift register unit 10), several more stages of shift register units 10 may need to be provided, so that the quantity of shift register units 10 may be greater than the quantity of pixel rows in the display panel as a whole.

It should also be noted that, in the case that the panel layout of the plurality of cascaded shift register units is fixed in the existing technology, the scan output terminal of the shift register unit of previous stage may control the signal connection of the shift register unit of next stage. In contrast, referring to FIGS. 1-3, the input circuit 14 in embodiments of the present disclosure may be configured as a circuit for connecting the input signal in the single shift register unit 10, and the control terminal SW of the input circuit 14 may be respectively connected to the scan signal output terminals OUT of two shift register units 10 adjacent to the shift register unit 10, such that the input circuit 14 may be controlled by the signals of two adjacent shift register units 10. In such way, the shift register unit 10 in the gate drive circuit 1 may be compatible with the forward direction scan mode and the reverse direction scan mode. Therefore, the gate drive control solution with at least two modes may be provided, which may be suitable for various requirements and improve the compatibility of the display panel.

Exemplarily, in above-mentioned forward direction scan mode, the direction from the side away from the drive chip of the display panel to the side close to the drive chip of the display panel may be configured as the stage transmission direction of the scan signal SCAN; and in above-mentioned reverse direction scan mode, the direction away from the side of the drive chip to the side close to the drive chip of the display panel may be configured as the stage transmission direction of the scan signal SCAN.

Exemplarily, the ground may also be configured as a reference. In the case of placed display panel where the gate drive circuit 1 is located with normal display picture as a reference, when the scan signal SCAN is sequentially outputted to the sub-pixels from top to bottom, it may be considered that the gate drive circuit 1 operates in the forward direction scan mode; and the scan mode from bottom to top may be considered as that the gate drive circuit 1 operates in reverse direction scan mode.

In some optional embodiments, referring to FIGS. 1-4, in the gate drive circuit 1, along the first direction X, the control terminal SW of the input circuit 14 in the first shift register unit 10 may be electrically connected to the start transmission signal line STV.

The control terminal SW of the input circuit 14 in the n-th shift register unit 10 may be electrically connected to the start transmission signal line STV.

It should be noted that, when the shift register unit 10 operates in the forward direction scan mode, the control terminal SW of the input circuit 14 in the first shift register unit 10 arranged along the first direction X may be electrically connected to the start transmission signal line STV and connected to the start signal transmitted by the start transmission signal line STV. At this point, the control terminal SW of the input circuit 14 in the n-th shift register unit 10 may not be connected to the start signal transmitted by the start transmission signal line STV, and the control terminal SW of the input circuit 14 in the n-th shift register unit 10 may be electrically connected to the scan signal output terminal OUT of the (n−1)-th shift register unit 10.

When the shift register unit 10 operates in the reverse direction scan mode, the control terminal SW of the input circuit 14 in the first shift register unit 10 arranged along the first direction X may not be connected to the start signal transmitted by the start transmission signal line STV; and the control terminal SW of the input circuit 14 in the first shift register unit 10 may be electrically connected to the scan signal output terminal OUT of the second shift register unit 10. The control terminal SW of the input circuit 14 in the n-th shift register unit 10 may be electrically connected to the start transmission signal line STV and connected to the start signal transmitted by the start transmission signal line STV.

In some optional embodiments, referring to FIGS. 1-2, by distinguishing the start transmission signal lines STV to realize the forward/reverse direction scan modes, the first shift register unit 10 and the n-th shift register unit 10 arranged along the first direction X may have different connection controls of the start signal.

Exemplarily, the start transmission signal line STV may include a first start transmission signal line STV1 and a second start transmission signal line STV2. The first start transmission signal line STV1 may be electrically connected to the control terminal SW of the input circuit 14 in the first shift register unit 10 arranged along the first direction X; and the second start transmission signal line STV2 may be electrically connected to the control terminal SW of the input circuit 14 in the n-th shift register unit 10 arranged along the first direction X.

Figure 4:
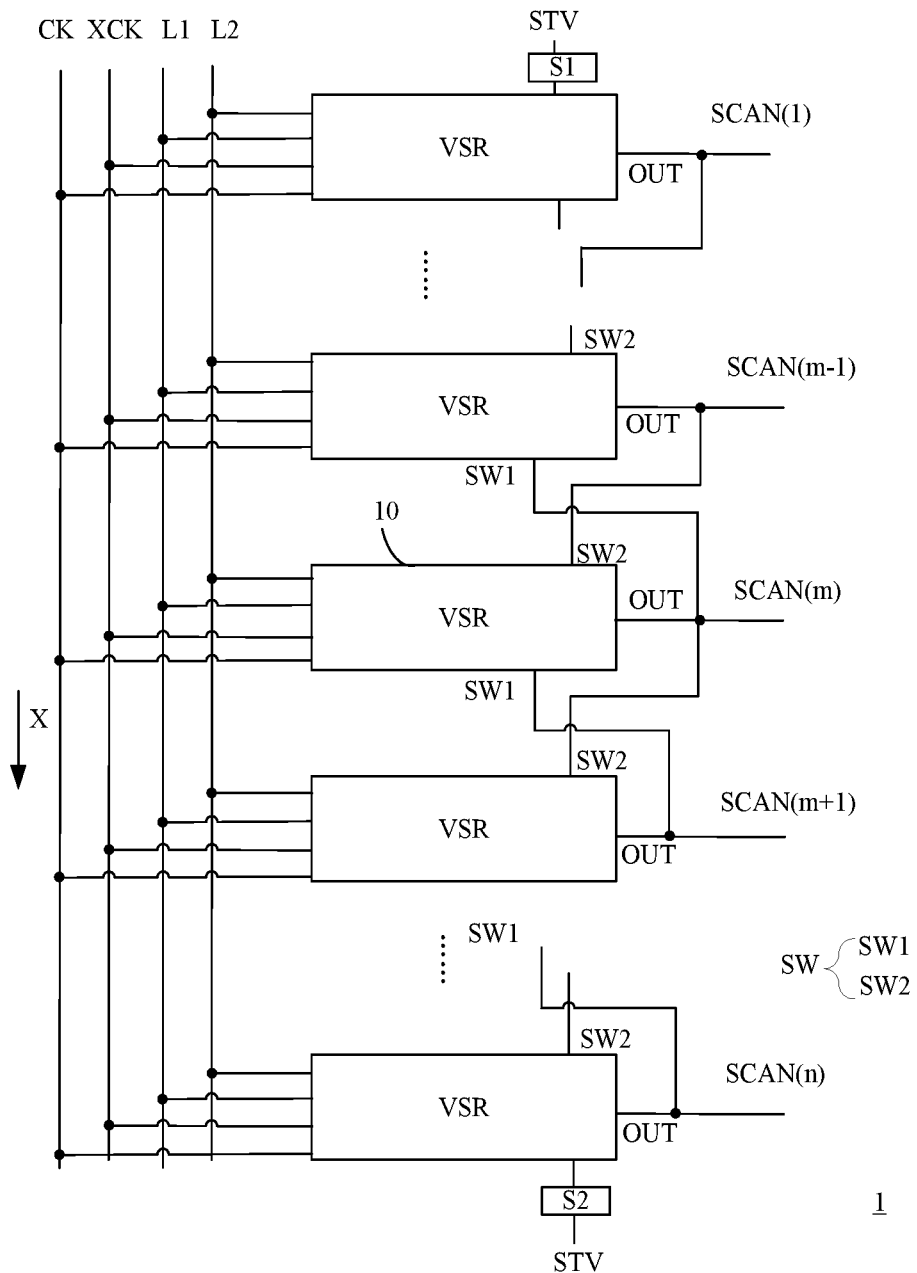
FIG. 4 illustrates another optional circuit structural schematic of a gate drive circuit according to various embodiments of the present disclosure.
Figure 5:
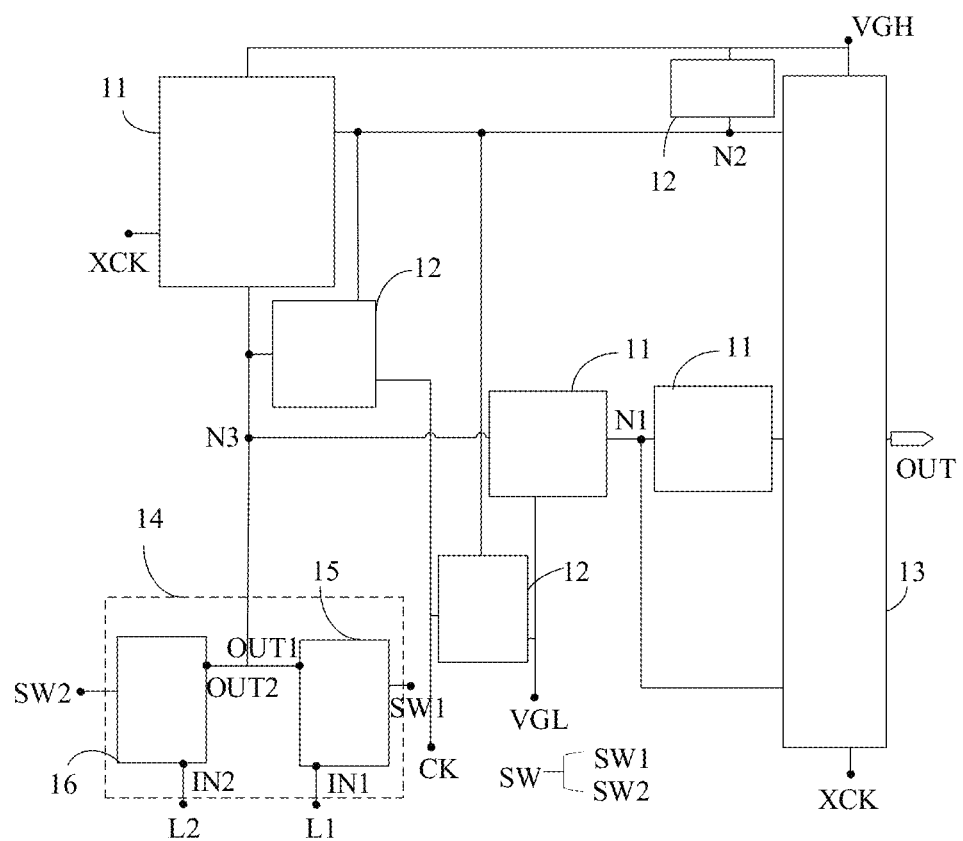
FIG. 5 illustrates another optional circuit structural schematic of a single shift register unit in a gate drive circuit according to various embodiments of the present disclosure.
Figure 6:
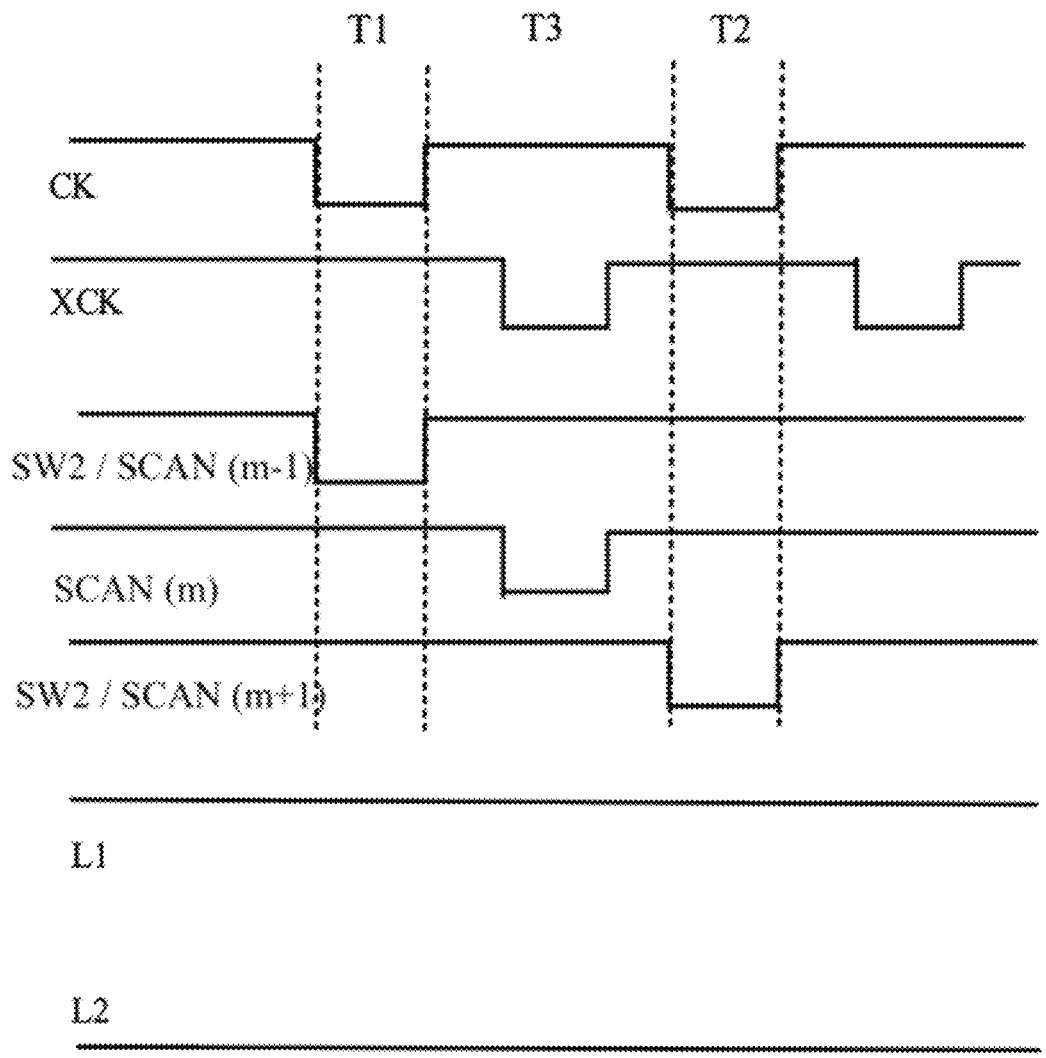
FIG. 6 illustrates a signal time sequence diagram when a gate drive circuit operates in a forward direction scan mode according to various embodiments of the present disclosure.
Figure 7:
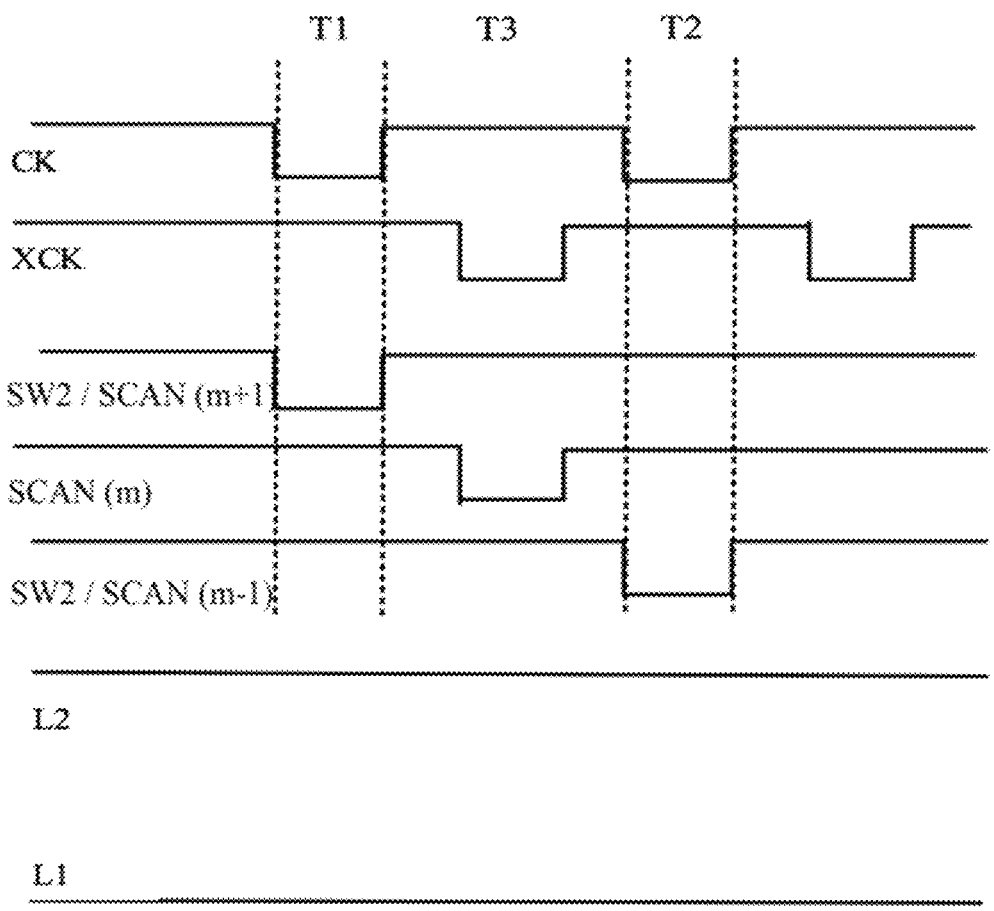
FIG. 7 illustrates a signal time sequence diagram when a gate drive circuit operates in a reverse direction scan mode according to various embodiments of the present disclosure.

In other optional embodiments, referring to FIGS. 2 and 4, the first selection switch S1 and the second selection switch S2 may also be configured. The start transmission signal line STV may be electrically connected to the control terminal SW of the input circuit 14 in the first shift register unit 10 arranged along the first direction X through the first selection switch S1; and the start transmission signal line STV may also be electrically connected to the control terminal SW of the input circuit 14 in the n-th shift register unit 10 arranged along the first direction X through the second selection switch S2.

When the shift register unit 10 operates in the forward direction scan mode, the first selection switch S1 may be controlled to be turned on, and the second selection switch S2 may be controlled to be turned off. When the shift register unit 10 operates in the reverse direction scan mode, the second selection switch S2 may be controlled to be turned on, and the first selection switch S1 may be controlled to be turned off. Therefore, through different state controls of the first selection switch S1 and the second selection switch S2, it may realize that in the forward/reverse direction scan modes, the first shift register unit 10 and the n-th shift register unit 10 arranged along the first direction X may have different connection controls of the start signal.

Above-mentioned start transmission signal line STV may control the input circuit 14 in the first or n-th shift register unit 10 arranged along the first direction X to receive an input signal. By being electrically connected to the start transmission signal line STV, the shift register unit 10 may be controlled to realize the connection of the input signal.

In one embodiment, along the first direction X, the control terminal SW of the input circuit 14 of the first shift register unit 10 may be configured to be electrically connected to the start transmission signal line STV, and the control terminal SW of the input circuit 14 of the n-th shift register unit 10 may be configured to be electrically connected to the start transmission signal line STV. Furthermore, when the shift register unit 10 operates in the forward/reverse direction scan modes, the first and last shift register units 10 may have different connection controls of the start signal. Therefore, in the forward/reverse direction scan modes, the first and last shift register units 10 along the first direction X may flexibly receive the control of the signals of adjacent shift register units 10 or the signal of the start transmission signal line STV. In such way, the input circuit 14 of the gate drive circuit 1 may have two signal input directions, which are compatible with the forward direction scan mode and the reverse direction scan mode. As a result, the gate drive control solution with at least two modes may be provided, which may be suitable for various requirements and improve the compatibility of the display panel.

In some optional embodiments, referring to FIGS. 1-5, FIG. 5 illustrates another optional circuit structural schematic of a shift register unit in the gate drive circuit according to various embodiments of the present disclosure.

The input circuit 14 of above shift register unit 10 may include a first input selection unit 15 and a second input selection unit 16.

The first input selection unit 15 may include a first input terminal IN1, a first output terminal OUT1 and a first control terminal SW1; and the second input selection unit 16 may include a second input terminal IN2, a second output terminal OUT2 and a second control terminal SW2.

The first input terminal IN1 may be electrically connected to a first signal line L1, and the first output terminal OUT1 may be electrically connected to the third node N3.

The second input terminal IN2 may be electrically connected to a second signal line L2, and the second output terminal OUT2 may be electrically connected to the third node N3.

Along the first direction X, the first control terminal SW1 of the m-th shift register unit 10 may be electrically connected to the scan signal output terminal OUT of the (m+1)-th shift register unit 10; and the second control terminal SW2 of the m-th shift register unit 10 may be electrically connected to the scan signal output terminal OUT of the (m−1)-th shift register unit 10.

In one embodiment, the first input selection unit 15 and the second input selection unit 16 may be configured in the input circuit 14. The first input selection unit 15 may be electrically connected to the scan signal output terminal OUT of the shift register unit 10 of next stage; and the second input selection unit 16 may be electrically connected to the scan signal output terminal OUT of the shift register unit 10 of previous stage. Therefore, the input circuit 14 of the shift register unit 10 may be selectively connected to the signal sent by the first signal line L1 or the second signal line L2.

It should also be noted that, for the first shift register unit 10 arranged along the first direction X, in the forward direction scan mode, the first control terminal SW1 may be electrically connected to the scan signal output terminal OUT of the second shift register unit 10, and the second control terminal SW2 may be electrically connected to the start transmission signal line STV.

For the n-th shift register unit 10 arranged along the first direction X, in the reverse direction scan mode, the first control terminal SW1 may be electrically connected to the start transmission signal line STV, and the second control terminal SW2 may be electrically connected to the scan signal output terminal OUT of the (n−1)-th shift register unit 10.

The first signal line L1 and the second signal line L2 may stably output level signals. Level signals transmitted by the first signal line L1 and the second signal line L2 may be different. For example, when the first signal line L1 outputs a high-level signal, the second signal line L2 may output a low-level signal. For another embodiment, when the first signal line L1 outputs a low-level signal, the second signal line L2 may output a high-level signal.

In some embodiments, by configuring the first input selection unit 15 and the second input selection unit 16 in the input circuit 14, the input circuit 14 may be configured to, according to the signal outputted from the scan signal output terminal OUT of the shift register unit 10 adjacent to the shift register unit 10 where the input circuit 14 is located, selectively control the level signal of the first signal line L1 or the level signal of the second signal line L2 to be transmitted to the third node N3, thereby providing an optional implementation solution for the node potential change of the third node N3. Finally, single shift register unit 10 may be adapted to changes in the forward and reverse direction scan modes and have enhanced adaptability.

Referring to FIGS. 1-6, FIG. 6 illustrates a signal time sequence diagram of each signal when the gate drive circuit operates in the forward direction scan mode according to various embodiments of the present disclosure.

It should be noted that embodiments of the present disclosure are described by taking the thin film transistors in the shift register unit 10 and the pixel circuit as P-type thin film transistors as an example in conjunction with drawings. In other embodiments, N-type thin film transistors may also be configured in the shift register unit and the pixel circuit. For example, when the scan signal output terminal OUT of the shift register unit 10 outputs a high-stage scan signal SCAN, the pixel circuit may enter an initialization stage.

In one embodiment, when the gate drive circuit 1 operates in the forward direction scan mode, the first signal line L1 may transmit a high-level signal, and the second signal line L2 may transmit a low-level signal.

When the gate drive circuit 1 operates in the forward direction scan mode, the shift register units 10 arranged sequentially along the first direction X in the gate drive circuit 1 may output the scan signal SCAN stage by stage.

At a T1 period, the second control terminal SW2 in the m-th shift register unit 10 arranged along the first direction X may be electrically connected to the scan signal output terminal OUT in the (m−1)-th shift register unit 10; the second control terminal SW2 may be connected to the low-level signal outputted from the scan signal output terminal OUT of the (m−1)-th shift register unit 10; and the second input selection unit 16 may be turned on.

The first control terminal SW1 may be electrically connected to the scan signal output terminal OUT of the (m+1)-th shift register unit 10; the first control terminal SW1 may receive the high-level signal outputted from the scan signal output terminal OUT of the (m+1)-th shift register unit 10; and the first input selection unit 15 may be turned off.

At this point, the second input terminal IN2 of the m-th shift register unit 10 may be connected to the low-level signal transmitted by the second signal line L2, and the low-level signal may be transmitted to the third node N3 through the second input selection unit 16. The potential of the third node N3 may be changed, so that the m-th shift register unit 10 may be connected to the low-stage input signal. In such way, the scan signal output terminal OUT of the m-th shift register unit 10 may output the low-level signal at next period, that is, the T3 period.

At the period T3, when the scan signal output terminal OUT of the m-th shift register unit 10 arranged along the first direction X stably outputs the low-level signal, the second control terminal SW2 in the (m+1)-th shift register unit 10 arranged along the first direction X may be electrically connected to the scan signal output terminal OUT in the m-th shift register unit 10, and the first control terminal SW1 of the (m−1)-th shift register unit 10 arranged along the first direction X may be also electrically connected to the scan signal output terminal OUT of the m-th shift register unit 10.

At this point, the second input selection unit 16 in the (m+1)-th shift register unit 10 arranged along the first direction X may be turned on, and the second input terminal IN2 of the (m+1)-th shift register unit 10 may be connected to the low-level signal transmitted by the second signal line L2. In such way, the scan signal output terminal OUT of the (m+1)-th shift register unit 10 may output the low-level signal in next period, that is, a period T2.

The first input selection unit 15 in the (m−1)-th shift register unit 10 arranged along the first direction X may be turned on, and the first input terminal IN1 of the (m−1)-th shift register unit 10 may be connected to the high-level signal transmitted by the first signal line L1. In such way, the (m−1)-th shift register unit 10 may reset the signal of the third node N3, and the scan signal output terminal OUT of the (m−1)-th shift register unit 10 may output the high-level signal in next period, that is, the period T2.

At the period T2, when the scan signal output terminal OUT of the (m+1)-th shift register unit 10 arranged along the first direction X stably outputs the low-level signal, the first control terminal SW1 in the m-th shift register unit 10 may be electrically connected to the scan signal output terminal OUT in the (m+1)-th shift register unit 10. The first input selection unit 15 in the m-th shift register unit 10 may be turned on, and the first input terminal IN1 of the m-th shift register unit 10 may write the high-level signal transmitted by the first signal line L1 into the third node N3. In such way, the m-th shift register unit 10 may reset the signal of the third node N3, so that the m-th shift register unit 10 may output the high-level signal in next period.

In some embodiments, when the gate drive circuit 1 operates in the forward direction scan mode, the first signal line L1 may transmit the high-level signal, and the second signal line L2 may transmit the low-level signal, such that single shift register unit 10 may selectively input high and low-level signals to change the potential of the third node N3. Therefore, when the gate drive circuit 1 operates in the forward direction scan mode, the potential of the third node N3 may be changed at different periods to ensure stable output of the scan signal SCAN.

Referring to FIGS. 1-6, in one embodiment, when the gate drive circuit 1 operates in the forward direction scan mode, the gate drive circuit 1 may include the first period T1 and the second period T2.

The thin film transistors in the shift register unit 10 and the pixel circuit may be P-type thin film transistors; and when the scan signal SCAN outputted to the pixel circuit is the low-stage, the pixel circuit may enter the initialization stage, which is taken as an example for description. In such way, in single signal output cycle of single shift register unit 10, the occurrence time of the first period T1 may be earlier than the second period T2. Above-mentioned single signal output cycle refers to the cycle in which the shift register unit 10 may control one sub-pixel to completely write the data of one data frame.

At the first period T1, in the m-th shift register unit 10, the second control terminal SW2 may make the second input selection unit 16 to be turned on in response to the enable signal outputted from the scan signal output terminal OUT of the (m−1)-th shift register unit 10. The first control terminal SW1 may make the first input selection unit 15 to be turned off in response to the disenable signal outputted from the scan signal output terminal OUT of the (m+1)-th shift register unit 10. Therefore, the low-level signal transmitted by the second signal line L2 may be written into the first node N1 through the third node N3.

It should be noted above-mentioned first period T1 may be a period that the scan signal output terminal OUT of the (m−1)-th shift register unit 10 arranged along the first direction X outputs the low-stage scan signal SCAN to make connected pixel circuit enter initialization.

Above enable signal may be the low-stage scan signal SCAN, and above disenable signal may be the high-stage scan signal SCAN.

When the gate drive circuit 1 operates in the forward direction scan mode, at the first period T1, the scan signal SCAN outputted from the (m−1)-th shift register unit 10 arranged along the first direction X may be the low stage. Such scan signal SCAN may also be electrically connected to the second control terminal SW2 in the m-th shift register unit 10. Therefore, the low-stage scan signal SCAN may be multiplexed as the enable signal, which may control the second input selection unit 16 in the m-th shift register unit 10 to be turned on.

At this point, the scan signal output terminal OUT of the (m+1)-th shift register unit 10 arranged along the first direction X may output the high-stage scan signal SCAN. Such high-stage scan signal SCAN may be electrically connected to the first control terminal SW1 in the m-th shift register unit 10. Therefore, the high-stage scan signal SCAN may be multiplexed as the disenable signal, which may control the first input selection unit 15 in the m-th shift register unit 10 to be turned off.

Therefore, at the first period T1, the second input selection unit 16 in the m-th shift register unit 10 may be turned on, and the first input selection unit 15 may be turned off. In such way, the low-level signal transmitted by the second signal line L2 may be written into the first node N1 through the third node N3.

At the second period T2, in the m-th shift register unit 10, the second control terminal SW2 may make the second input selection unit 16 to be turned off in response to the disenable signal outputted from the scan signal output terminal OUT of the (m−1)-th shift register unit 10; and the first control terminal SW1 may make the first input selection unit 15 to be conduction in response to the enable signal outputted from the scan signal output terminal OUT of the (m+1)-th shift register unit 10. In such way, the high-level signal transmitted by the first signal line L1 may be written into the first node N1 through the third node N3.

It should be noted that above-mentioned second period T2 may be a period that the scan signal output terminal OUT of the (m+1)-th shift register unit 10 arranged along the first direction X outputs the low-stage scan signal SCAN to make corresponding electrically connected pixel circuit enter initialization.

When the gate drive circuit 1 operates at the second period T2 of the forward direction scan mode, the scan signal SCAN outputted from the (m+1)-th shift register unit 10 arranged along the first direction X may be a low stage. Such scan signal SCAN may also be electrically connected to the first control terminal SW1 in the m-th shift register unit 10. Therefore, the low-stage scan signal SCAN may be multiplexed as the enable signal, which may control the first input selection unit 15 in the m-th shift register unit 10 to be turned on.

At this point, the scan signal output terminal OUT of the (m−1)-th shift register unit 10 may output the high-stage scan signal SCAN. Such high-stage scan signal SCAN may be electrically connected to the second control terminal SW2 in the m-th shift register unit 10. Therefore, the high-stage scan signal SCAN may be multiplexed as the disenable signal, which may control the second input selection unit 16 in the m-th shift register unit 10 to be turned off.

Therefore, at the second period T2, the second input selection unit 16 in the m-th shift register unit 10 may be turned off, and the first input selection unit 16 may be turned on. In such way, the high-level signal transmitted by the first signal line L2 may be written into the first node N1 through the third node N3.

In some embodiments, at different periods, the first control terminal SW1 and the second control terminal SW1 of the m-th shift register unit 10 may be respectively inputted with different signals by the (m+1)-th shift register unit 10 and the (m−1)-th shift register unit 10 arranged along the first direction X Terminal SW2. One input selection unit may be selected to be turned on at different periods, such that the third node N3 of the shift register unit 10 may change stages at different periods, thereby being applicable to the requirement when single shift register unit 10 operates in the forward direction scan mode.

Referring to FIGS. 1-3 and 6, FIG. 6 illustrates a signal time sequence diagram of the first signal line L1 and the second signal line L2 when the gate drive circuit 1 operates in the reverse direction scan mode.

When the gate drive circuit 1 operates in the reverse direction scan mode, the first signal line L1 may transmit the low-level signal VGL, and the second signal line L2 may transmit the high-level signal VGH.

The driver chip located at the lower side of the display region of the display panel is still taken as an example for illustration. When the gate drive circuit 1 operates in the reverse direction scan mode, along the first direction X, the shift register units 10 in the gate drive circuit 1 may output the scan signal SCAN stage-by-stage along the direction away from the drive chip.

At this point, along the first direction X, the first input selection unit 15 in the m−th shift register unit 10 may be controlled by the signal of the scan signal output terminal OUT in the (m+1)-th shift register unit 10; the second control terminal SW2 may be electrically connected to the scan signal output terminal OUT of the (m−1)-th shift register unit 10; the second control terminal SW2 may receive the high-level signal outputted from the scan signal output terminal OUT of the (m−1)-th shift register unit 10; and the second input selection unit 16 may be turned off.

At this point, the first input terminal IN1 of the m-th shift register unit 10 may be connected to the low-level signal transmitted by the first signal line L1, and the low-level signal may be transmitted to the third node N3 through the first input selection unit 15. The third node N3 may generate a potential change, and the m-th shift register unit 10 may be thus connected to the low-stage input signal, such that the scan signal output terminal OUT of the m-th shift register unit 10 may output the low-level signal at next period, that is, the period T3.

At the period T3, when the scan signal output terminal OUT of the m-th shift register unit 10 arranged along the first direction X stably outputs the low-level signal, the first control terminal SW1 in the (m−1)-th shift register unit 10 arranged along the first direction X may be electrically connected to the scan signal output terminal OUT in the m-th shift register unit 10; and the second control terminal SW2 of the (m+1)-th shift register unit 10 arranged along the first direction X may be also electrically connected to the scan signal output terminal OUT of the m-th shift register unit 10.

At this point, the first input selection unit 16 in the (m−1)-th shift register unit 10 arranged along the first direction X may be turned on, and the first input terminal IN1 of the (m−1)-th shift register unit 10 may be connected to the low-level signal transmitted by the first signal line L1. In such way, the scan signal output terminal OUT of the (m−1)-th shift register unit 10 may output the low-level signal at next period, that is, the period T2.

The second input selection unit 15 in the (m+1)-th shift register unit 10 arranged along the first direction X may be turned on, and the second input terminal IN2 of the (m+1)-th shift register unit 10 may be connected to the high-level signal transmitted by the second signal line L2. In such way, the (m+1)-th shift register unit 10 may realize the signal reset of the third node N3, and the scan signal output terminal OUT of the (m+1)-th shift register unit 10 may output the high-level signal at next period, that is, the period T2.

At the period T2, when the scan signal output terminal OUT of the (m−1)-th shift register unit 10 arranged along the first direction X stably outputs the low-level signal, the second control terminal SW2 in the m-th shift register unit 10 may be electrically connected to the scan signal output terminal OUT in the (m−1)-th shift register unit 10. The second input selection unit 16 in the m-th shift register unit 10 may be turned on, and the second input terminal IN2 in the m-th shift register unit 10 may write the high-level signal transmitted by the second signal line L2 into the third node N3, such that the m-th shift register unit 10 may realize the signal reset of the third node N3. Therefore, the m-th shift register unit 10 may output the high-level signal at next period.

In some embodiments, when the gate drive circuit 1 operates in the reverse direction scan mode, the first signal line L1 may transmit the low-level signal, and the second signal line L2 may transmit the high-level signal, such that single shift register unit 10 may selectively input high and low level signals, thereby changing the potential of the third node N3. Therefore, when the gate drive circuit 1 operates in the reverse direction scan mode, the potential of the third node N3 may be changed at different periods to ensure stable output of the scan signal SCAN.

Referring to FIGS. 1-5 and 7, in one embodiment, the gate drive circuit 1 may include the first period T1 and the second period T2 when operating in the reverse direction scan mode.

The thin film transistors in the shift register unit 10 and the pixel circuit may be P-type thin film transistors; and when the scan signal SCAN outputted to the pixel circuit is the low stage, the pixel circuit may enter the initialization stage, which may be taken as example for description. Therefore, in single signal output cycle of single shift register unit 10, the occurrence time of the first period T1 may be earlier than that of the second period T2.

At the first period T1, in the m-th shift register unit 10, the first control terminal SW1 may make the first input selection unit 15 to be turned on in response to the enable signal outputted from the scan signal output terminal OUT of the (m+1)-th shift register unit 10. The second control terminal SW2 may make the second input selection unit 16 to be turned off in response to the disenable signal outputted from the scan signal output terminal OUT of the (m−1)-th shift register unit 10, such that the low-level signal transmitted by the first signal line L1 may be written into the first node N1 through the third node N3.

It should be noted that above first period T1 may be a period that the scan signal output terminal OUT of the (m+1)-th shift register unit 10 arranged along the first direction X outputs the low-stage scan signal SCAN to make connected pixel circuit enter initialization.

Above enable signal may be the low-level signal of the scan signal SCAN, and above disenable signal may be the high-level signal of the scan signal SCAN.

When the gate drive circuit 1 operates in the reverse direction scan mode, at the first period T1, the scan signal SCAN outputted from the (m+1)-th shift register unit 10 arranged along the first direction X may be the low stage. Such scan signal SCAN may be electrically connected to the first control terminal SW1 in the m-th shift register unit 10. Therefore, the low-stage scan signal SCAN may be multiplexed as the enable signal, which may control the first input selection unit 15 in the m-th shift register unit 10 to be turned on.

At this point, the scan signal output terminal OUT of the (m−1)-th shift register unit 10 arranged along the first direction X may output the high-stage scan signal SCAN. Such high-stage scan signal SCAN may be electrically connected to the second control terminal SW2 in the m-th shift register unit 10. Therefore, the high-stage scan signal SCAN may be multiplexed as the disenable signal, which may control the second input selection unit 16 in the m-th shift register unit 10 to be turned off.

Therefore, at the first period T1, the first input selection unit 15 in the m-th shift register unit 10 may be turned on, and the second input selection unit 16 may be turned off, such that the low-level signal transmitted by the first signal line L1 may be written into the first node N1 through the third node N3.

At the second period T2, in the m-th shift register unit 10, the first control terminal SW1 may make the first input selection unit 15 to be turned off in response to the disenable signal outputted from the scan signal output terminal OUT of the (m+1)-th shift register unit 10, and the second control terminal SW2 may make the second input selection unit 16 to be turned on in response to the enable signal outputted from the scan signal output terminal OUT of the (m+1)-th shift register unit 10, such that the high-level signal transmitted by the second signal line L2 may be written into the first node N1 through the third node N3.

It should be noted that, above-mentioned second period T2 may be a period that the scan signal output terminal OUT of the (m−1)-th shift register unit 10 arranged along the first direction X outputs the high-stage scan signal SCAN to initialize corresponding electrically connected pixel circuit.

When the gate drive circuit 1 operates at the second period T2 of the forward direction scan mode, the scan signal SCAN outputted from the (m−1)-th shift register unit 10 arranged along the first direction X may be the low stage. Such scan signal SCAN may also be electrically connected to the second control terminal SW2 in the m-th shift register unit 10. Therefore, the low-stage scan signal SCAN may be multiplexed as an enable signal, which may control the second input selection unit 16 in the m-th shift register unit 10 to be turned on.

At this point, the scan signal output terminal OUT of the (m+1)-th shift register unit 10 may output the high-stage scan signal SCAN. Such high-stage scan signal SCAN may be electrically connected to the first control terminal SW1 in the m-th shift register unit 10. Therefore, the high-stage scan signal SCAN may be multiplexed as a disenable signal, which may control the first input selection unit 15 in the m-th shift register unit 10 to be turned off.

Therefore, at the second period T2, the second input selection unit 16 in the m-th shift register unit 10 may be turned on, and the first input selection unit 15 may be turned off, such that the high-level signal transmitted by the second signal line L2 may be written into the first node N1 through the third node N3.

In some embodiments, at different periods, the second control terminal SW2 and the first control terminal SW1 of the m-th shift register unit 10 may be respectively inputted with different signals by the (m−1)-th shift register unit 10 and the (m+1)-th shift register unit 10 arranged along the first direction X. One input selection unit may be selected to be turned on at different periods, such that the third node N3 of the shift register unit 10 may change stages at different periods, thereby being applicable to the requirement when single shift register unit 10 operates in the forward direction scan mode.

Figure 8:
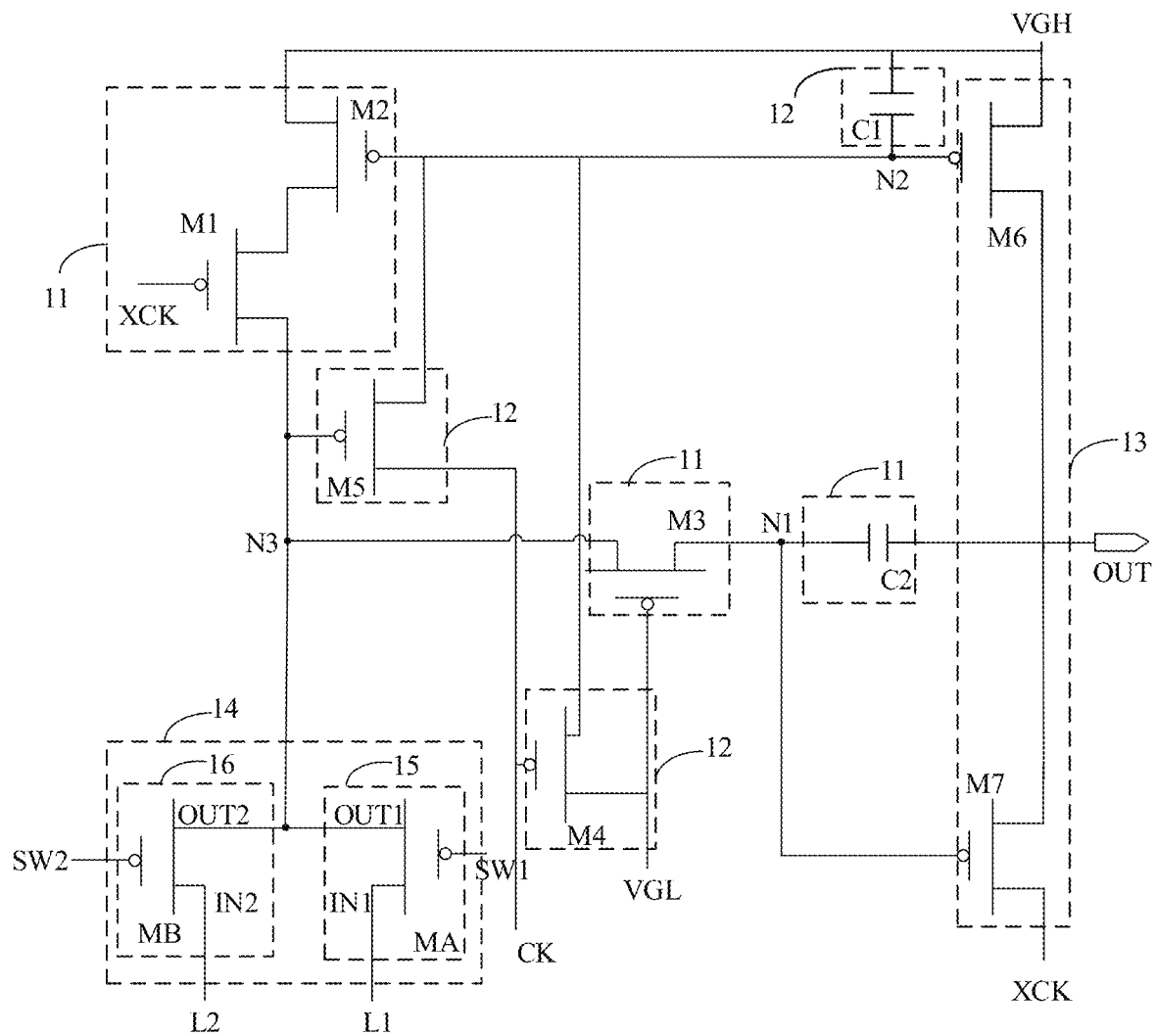
FIG. 8 illustrates an optional circuit structural schematic of a single shift register unit in a gate drive circuit according to various embodiments of the present disclosure.
Figure 9:
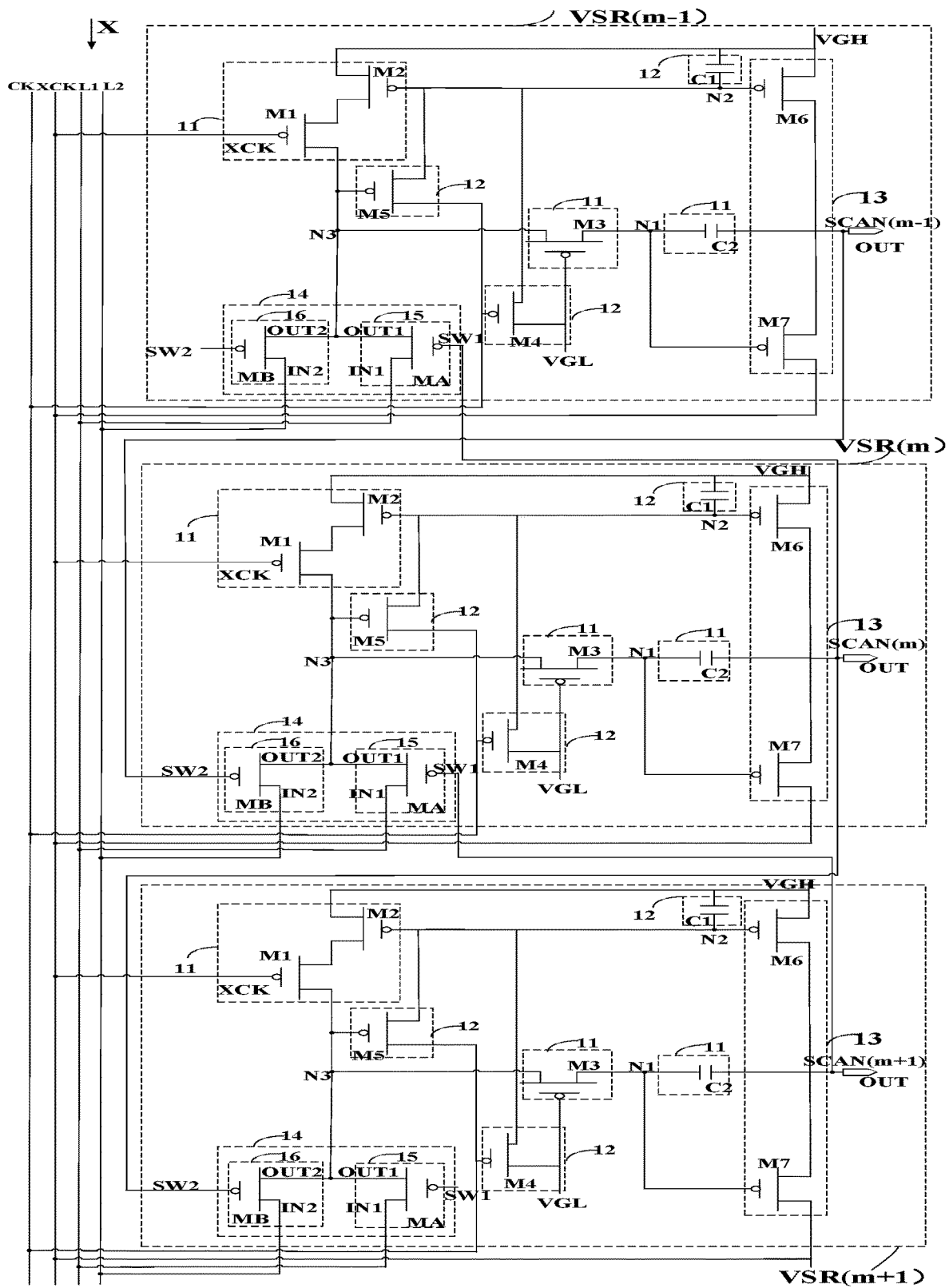
FIG. 9 illustrates an optional circuit structural schematic where three shift register units are cascaded in a gate drive circuit according to various embodiments of the present disclosure.

Referring to FIGS. 1-9, FIG. 8 illustrates an optional circuit structural schematic of single shift register unit in the gate drive circuit according to various embodiments of the present disclosure; and FIG. 9 illustrates an optional circuit structural schematic where shift register units are cascaded in FIG. 8 according to various embodiments of the present disclosure.

In one embodiment, the first input selection unit 15 may include the first switch MA. The input terminal of the first switch MA may be the first input terminal IN1, the output terminal of the first switch MA may be the first output terminal OUT1, and the control terminal of the first switch MA may be the first control terminal SW1.

The second input selection unit 16 may include the second switch MB. The input terminal of the second switch MB may be the second input terminal IN2, the output terminal of the second switch MB may be the second output terminal OUT2, and the control terminal of the second switch MB may be the second control terminal SW2.

Referring to FIGS. 3 and 8, the input terminal of the first switch MA may be electrically connected to the first signal line L1, and the output terminal of the first switch MA may be electrically connected to the third node N3. The input terminal of the second switch MB may be electrically connected to the second signal line L2, and the output terminal of the second switch MB may be electrically connected to the third node N3.

For the m-th shift register unit 10 arranged along the first direction X, the control terminal of the first switch MA may be electrically connected to the scan signal output terminal OUT of the (m+1)-th shift register unit 10, and the control terminal of the second switch MB may be electrically connected to the scan signal output terminal OUT of the (m−1)-th shift register unit 10.

Above-mentioned first switch MA and the second switch MB may be thin film field effect transistors (TFT), and the types of the first switch MA and the second switch MB may be set according to actual needs. Exemplarily, both the first switch MA and the second switch MB may be P-type thin film field effect transistors.

In some embodiments, the optional circuit structures of the first input selection unit 15 and the second input selection unit 16 may be correspondingly provided through connection configuration of the first switch MA and the second switch MB, which may provide technical basis for the gate drive circuit 1 to be compatible with forward and reverse direction scan modes.

In order to better illustrate the scan drive solution of the gate drive circuit 1 in the present disclosure, other circuit structures other than the input circuit 14 in the gate drive circuit 1 of embodiment of the present disclosure are illustrated hereinafter.

It should be noted that FIG. 8 illustrates an optional circuit structural schematic of the gate drive circuit according to embodiment of the present disclosure. Obviously, in other embodiments, other circuit structures in above gate drive circuit 1 except the input circuit 14 may be set according to actual needs.

In FIG. 8, the first node control circuit 11 may include the first transistor M1, the second transistor M2, the third transistor M3, and the second capacitor C2.

The first transistor M1 may be electrically connected to the second transistor M2 and the third node N3 respectively; and the control terminal of the first transistor M1 may be electrically connected to the first clock signal line XCK.

The second transistor M2 may be electrically connected to the constant-voltage high-level signal line VGH and the first transistor M1 respectively; and the control terminal of the second transistor M2 may be electrically connected to the second node N2.

The third transistor M3 may be electrically connected to the third node N3 and the first node N1 respective; and the control terminal of the third transistor M3 may be electrically connected to the constant-voltage low-level signal line VGL.

The second capacitor C2 may be configured between the scan signal output terminal OUT and the first node N1.

The second node control circuit 12 may include the fourth transistor M4, the fifth transistor M5 and the first capacitor C1.

The fourth transistor M4 may be electrically connected to the constant-voltage low-level signal line VGL and the second node N2 respectively; and the control terminal of the fourth transistor M4 may be electrically connected to the second clock signal line CK.

The fifth transistor M5 may be electrically connected to the second clock signal line CK and the second node N2 respectively; and the control terminal of the fifth transistor M5 may be electrically connected to the third node N3.

The first capacitor C1 may be electrically connected between the constant-voltage high-level signal line VGH and the second node N2.

The output control circuit 13 may include the sixth transistor M6 and the seventh transistor M7.

The sixth transistor M6 may be electrically connected to the scan signal output terminal OUT and the constant-voltage high-level signal line VGH respectively; and the control terminal of the seventh transistor M7 may be connected to the second node N2.

The seventh transistor M7 may be electrically connected to the first clock signal line XCK and the scan signal output terminal OUT respectively; and the control terminal of the seventh transistor M7 may be electrically connected to the first node N1.

All above-mentioned first switch MA to fifth transistor M5 may be P-type thin film transistors.

Referring to FIGS. 1-6 and 8-9, when the gate drive circuit 1 operates in the forward direction scan mode, the first signal line L1 may transmit the high-level signal, and the second signal line L2 may transmit the low-level signal.

At the first period T1, the scan signal output terminal OUT of the (m−1)-th shift register unit 10 arranged along the first direction X may output the low stage; the scan signal output terminal OUT of the (m+1)-th shift register unit 10 may output the high stage; the first clock signal may be at the high stage; and the second clock signal may be at the low stage.

At this point, the second control terminal SW2 of the m-th shift register unit 10 arranged along the first direction X may be connected to the low stage outputted from the scan signal output terminal OUT of previous stage shift register unit 10; the second input selection unit 16 where the second control terminal SW2 is located may be turned on; in the m-th shift register unit 10, the first control terminal SW1 may be connected to the high stage outputted from the scan signal output terminal OUT of next stage shift register unit 10; and the first input selection unit 15 where the first control terminal SW1 is located may be turned off.

That is, the second input selection unit 16 in the m-th shift register unit 10 may be turned on; the first input selection unit 15 may be turned off; the second input selection unit 16 may write the low-level signal transmitted by the second signal line L2 into the third node N3; the third transistor M3 may be turned on under constant-voltage low-stage control; the low stage of the third node N3 may be transmitted to the first node N1 through the third transistor M3; and the first node N1 may be also at the low stage.

The first node N1 maintains the low stage, so that the seventh transistor M7 in the output control circuit 13 may be turned on. The third node N3 maintain the low stage, so that the fifth transistor M5 may be turned on, and the low-level signal transmitted by the second clock signal line CK may be transmitted to the second node N2 through the fifth transistor M5. The control terminal of the fourth transistor M4 may be electrically connected to the second clock signal line CK; the second clock signal line CK may output the low stage so that the fourth transistor M4 may be turned on; and the constant voltage low stage may be transmitted to the second node N2 through the fourth transistor M4, such that the sixth transistor M6 in the output control circuit 13 may be controlled to be turned on. The combination of the constant voltage high stage and the high stage outputted from the first clock signal line XCK may be outputted as the scan signal SCAN through the scan signal output terminal OUT.

In the third period T3 between the first period T1 and the second period T2, the first clock signal line XCK may transmit the low-level signal, the second clock signal line CK may transmit the high-level signal, the fourth transistor M4 may be turned off, and the first transistor M1 may be turned on.

The scan signal output terminal OUT of the (m−1)-th shift register unit 10 arranged along the first direction X may output the high stage, and the scan signal output terminal OUT of the (m+1)-th shift register unit 10 may output the high stage. Both the first input selection unit 15 and the second input selection unit 16 of the m-th shift register unit 10 arranged along the first direction X may be turned off.

During such period, the second capacitor C2 may keep the first node N1 at the low stage, the seventh transistor M7 may be turned on, and the low-level signal transmitted by the first clock signal line XCK may be outputted as the scan signal SCAN through the scan signal output terminal OUT.

The third transistor M3 is turned on, the low-stage maintained by the first node N1 is transmitted to the third node N3 through the third transistor M4, such that the third node N3 may also maintain the low stage. The fifth transistor M5 may be turned on, and the high-stage transmitted by the second clock signal line CK may be written into the second node N2 through the fifth transistor M5. In such way, the second transistor M2 and the sixth transistor M6 may be turned off.

At the second period T2, the first clock signal line XCK may transmit the high stage, the second clock signal line CK may transmit the low stage, the first transistor M1 may be turned off, and the fourth transistor M4 may be turned on. The constant voltage low stage may be written into the second node N2 through the fourth transistor M4, the sixth transistor M6 may be turned on, the first capacitor C1 may keep the second node N2 at the low stage, and the constant voltage high stage may be outputted through the sixth transistor M6 and the scan signal output terminal OUT sequentially.

During such period, the scan signal output terminal OUT of the (m+1)-th shift register unit 10 arranged along the first direction X may be electrically connected to the first control terminal SW1 of the m-th shift register unit 10, the first control terminal SW1 may receive the low-level signal, and the first input selection unit 15 in the m-th shift register unit 10 may be turned on. The scan signal output terminal OUT of the (m−1)-th shift register unit 10 arranged along the first direction X may be electrically connected to the second control terminal SW2 in the m-th shift register unit 10, the second control terminal SW2 may receive the high-level signal, and the second input selection unit 16 in the m-th shift register unit 10 may be turned off. The high-level signal transmitted by the first signal line L1 may be written into the third node N3 through the first input selection unit 15, the third node N3 and the first node N1 may maintain the high stage, and the seventh transistor M7 and the fifth transistor M5 may be turned off.

Referring to FIGS. 1-5 and 7-9, when the gate drive circuit operates in the reverse direction scan mode, the first signal line L1 may transmit the low-level signal, and the second signal line L2 may transmit the high-level signal.

At the first period T1, along the first direction X, the scan signal output terminal OUT of the (m−1)-th shift register unit 10 may output the high stage, the scan signal output terminal OUT of the (m+1)-th shift register unit 10 may output the low-stage, the first clock signal may be at the high stage, and the second clock signal may be at the low stage.

At this point, the first control terminal SW1 of the m-th shift register unit 10 arranged along the first direction X may be electrically connected to the scan signal output terminal OUT of the (m+1)-th shift register unit 10, the first control terminal SW1 may receive the low-level signal, and the first input selection unit 15 in the m-th shift register unit 10 where the first control terminal SW1 is located may be turned on. The second control terminal SW2 in the m-th shift register unit 10 may be electrically connected to the scan signal output terminal OUT of the (m−1)-th shift register unit 10, the second control terminal SW2 may be connected to the high-level signal, and the second input selection unit 16 in the m-th shift register unit 10 where the second control terminal SW2 is located may be turned off.

That is, the first input selection unit 15 in the m-th shift register unit 10 may be turned on, the second input selection unit 16 may be turned off, the first input selection unit 15 may write the low-level signal transmitted by the first signal line L1 into the third node N3, the third transistor M3 may be turned on under constant-voltage low-stage control, the low-stage of the third node N3 may be transmitted to the first node N1 through the third transistor M3, and the first node N1 may be also at the low stage.

The first node N1 maintains the low stage, so that the seventh transistor M7 in the output control circuit 13 may be turned on. The third node N3 maintains the low stage, so that the fifth transistor M5 may be turned on. The low-level signal transmitted by the second clock signal line CK may be transmitted to the second node N2 through the fifth transistor M5. The control terminal of the fourth transistor M4 may be electrically connected to the second clock signal line CK, the second clock signal line CK may output the low stage so that the fourth transistor M4 may be turned on, and the constant voltage low stage may be transmitted to the second node N2 through the fourth transistor M4. Therefore, the sixth transistor M6 in the output control circuit 13 may be controlled to be turned on, and the combination of the constant voltage high stage and the high stage outputted from the first clock signal line XCK may be outputted as the scan signal SCAN through the scan signal output terminal OUT.

In the third period T3 between the first period T1 and the second period T2, the first clock signal line XCK may transmit the low-level signal, the second clock signal line CK may transmit the high-level signal, the fourth transistor M4 may be turned off, and the first transistor M1 may be turned on.

The scan signal output terminal OUT of the (m−1)-th shift register unit 10 arranged along the first direction X may output the high stage, and the scan signal output terminal OUT of the (m+1)-th shift register unit 10 may output the high stage. Both the first input selection unit 15 and the second input selection unit 16 of the m-th shift register unit 10 arranged along the first direction X may be turned off.

During such period, the second capacitor C2 may keep the first node N1 at the low stage, and the seventh transistor M7 may be turned on, and the low-level signal transmitted by the first clock signal line XCK may be outputted as the scan signal SCAN through the scan signal output terminal OUT.

The third transistor M3 is turned on, and the low-stage maintained by the first node N1 is transmitted to the third node N3 through the third transistor M4, so that the third node N3 may also maintain the low stage. The fifth transistor M5 is turned on, and the high-stage transmitted by the second clock signal is written into the second node N2 through the fifth transistor M5, so that the second transistor M2 and the sixth transistor M6 may be turned off.

At the second period T2, the first clock signal line XCK may transmit the high stage, the second clock signal line CK may transmit the low stage, the first transistor M1 may be turned off, and the fourth transistor M4 may be turned on. The constant voltage low stage may be written into the second node N2 through the fourth transistor M4, the sixth transistor M6 may be turned on, the first capacitor C1 may keep the second node N2 at the low stage, and the constant voltage high stage may be outputted through the sixth transistor M6 and the scan signal output terminal OUT sequentially.

During such period, the scan signal output terminal OUT of the (m−1)-th shift register unit 10 arranged along the first direction X may control the electrical connection of the second control terminal SW2 in the m-th shift register unit 10, the second control terminal SW2 may receive the low-level signal, and the second input selection unit 16 in the m-th shift register unit 10 may be turned on. The scan signal output terminal OUT of the (m+1)-th shift register unit 10 arranged along the first direction X may be electrically connected to the first control terminal SW1 of the m-th shift register unit 10, the first control terminal SW1 may receive the high-level signal, and the first input selection unit 15 in the m-th shift register unit 10 may be turned off. The high-level signal transmitted by the second signal line L2 may be written into the third node N3 through the first input selection unit 15, the third node N3 and the first node N1 may maintain the high stage, and the seventh transistor M7 and the fifth transistor M5 may be turned off.

In some embodiments, through the cooperative setting of the time sequence of each signal, combined with the setting of components in each circuit in the shift register unit 10, an optional implementation solution may be provided for the gate drive circuit 1 to achieve compatibility with forward and reverse direction scan modes. Normal output of the scan signal SCAN of the shift register unit 10 at each stage may be ensured under different scan modes.

Figure 10:
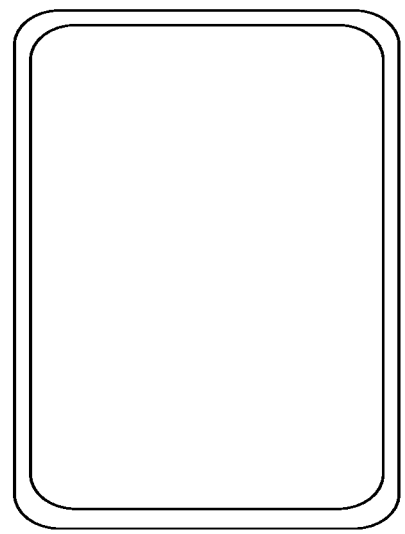
FIG. 10 illustrates an optional schematic of a display panel according to various embodiments of the present disclosure.

Referring to FIG. 10, embodiments of the present disclosure further provide a display panel, which may include a gate drive circuit. The gate drive circuit may be configured as the gate drive circuit provided in above-mentioned embodiments of the present disclosure.

Figure 11:
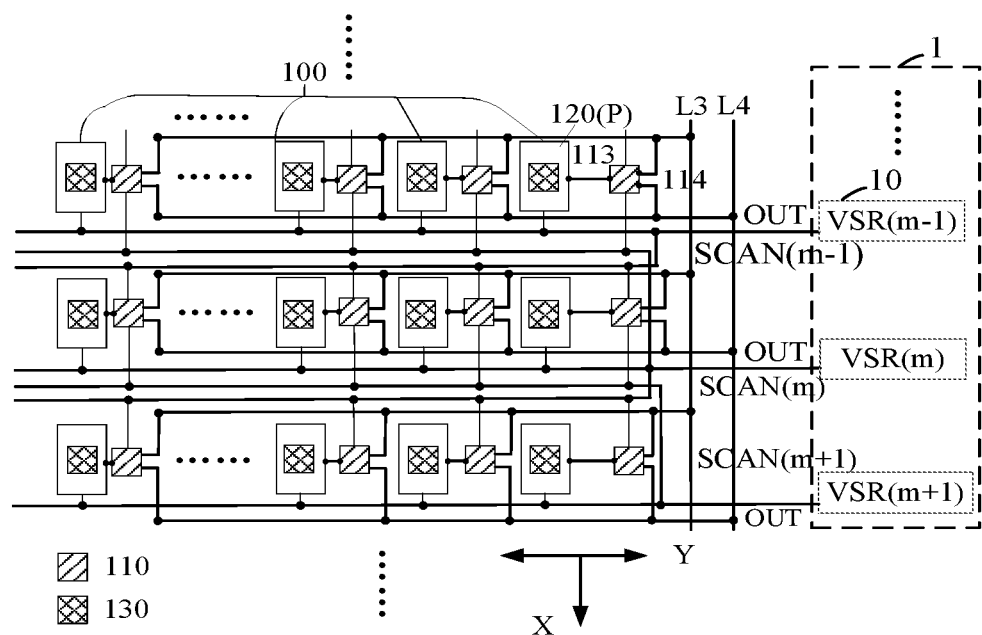
FIG. 11 illustrates an optional circuit structural schematic of a display panel according to various embodiments of the present disclosure.
Figure 12:
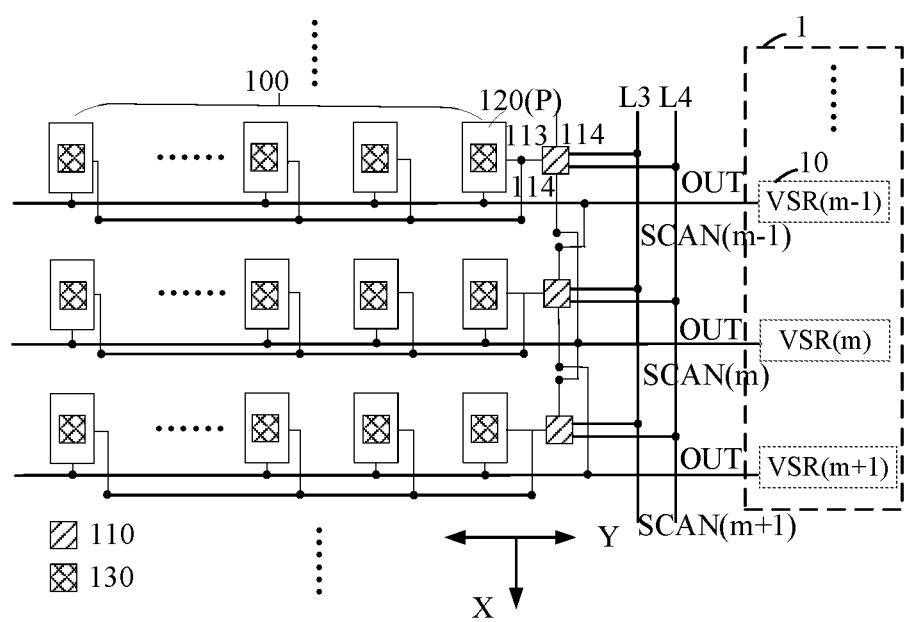
FIG. 12 illustrates another optional circuit structural schematic of a display panel according to various embodiments of the present disclosure.
Figure 13:
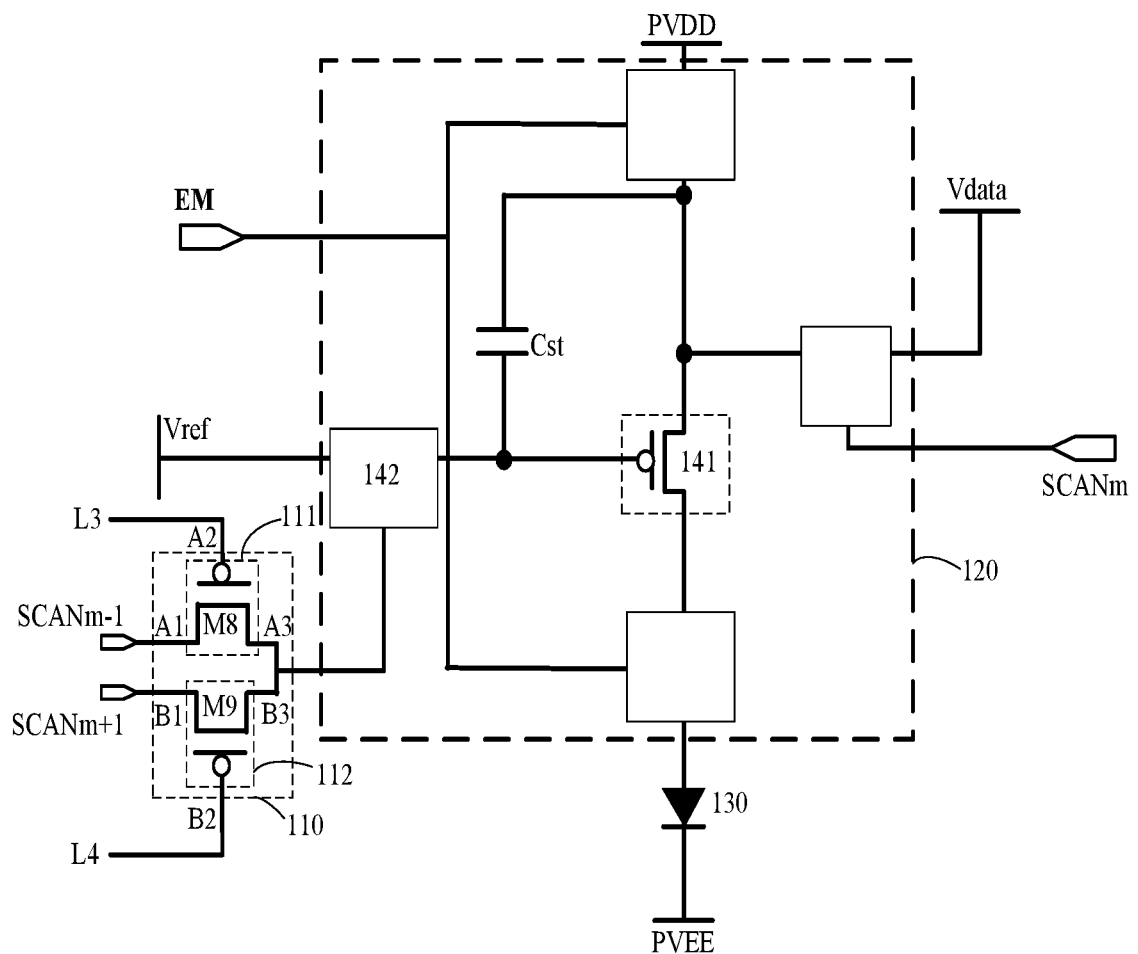
FIG. 13 illustrates an optional circuit structural schematic of a pixel circuit in a display panel according to various embodiments of the present disclosure.

In some optional embodiments of the display panel of the present disclosure, referring to FIGS. 11-13, above display panel may further include a plurality of forward and reverse direction scan selection circuits 110 and a plurality of pixel rows 100.

Above-mentioned pixel row 100 may include a plurality of sub-pixels P which may be arranged along the row direction Y. The sub-pixel P may include a pixel circuit 120 and a light-emitting element 130. The pixel circuit 120 may be configured to drive the light-emitting element 130 and provide a drive current for the light-emitting element 130.

The light-emitting element 130 may be a light-emitting diode (LED), an organic light-emitting display (OLED), or any other suitable elements.

The forward and reverse direction scan selection circuit 110 may be a circuit capable of controlling the pixel circuit 120 to be suitable for the forward direction scan mode or the reverse direction scan mode. The forward and reverse direction scan selection circuit 110 may be electrically connected to at least one pixel circuit 120 correspondingly.

Exemplarily, referring to FIG. 11, FIG. 11 illustrates an optional circuit structural schematic of the gate drive circuit 1, the forward and reverse direction scan selection circuit 110 and the pixel circuit 120 in the display panel according to embodiment of the present disclosure. The forward and reverse direction scan selection circuits 110 may be in a one-to-one correspondence with the pixel circuits 120. That is, each pixel circuit 120 may be correspondingly electrically connected to one forward and reverse direction scan selection circuit 110, thereby being beneficial for achieving precise control of the forward direction scan mode or the reverse direction scan mode.

Exemplarily, referring to FIG. 12, FIG. 12 illustrates another optional circuit structural schematic of the gate drive circuit 1, the forward and reverse direction scan selection circuit 110 and the pixel circuit 120 in the display panel according to embodiment of the present disclosure. In one embodiment, one forward and reverse direction scan selection circuit 110 mentioned above may be electrically connected to the pixel circuits 120 with the plurality of sub-pixels P in one pixel row 100. That is, the pixel circuits 120 in one row of sub-pixels P may be electrically connected to same forward and reverse direction scan selection circuit 110. The quantity of forward and reverse direction scan selection circuits 110 may be same as the quantity of pixel rows 100. Therefore, the quantity of the forward and reverse direction scan selection circuits 110 may be configured to be reduced, and the pixel circuit 120 may be suitable for the forward/reverse direction scan modes of the gate drive circuit 1.

Exemplarily, the forward and reverse direction scan selection circuit 110 may also be electrically connected to the pixel circuits 120 in other quantities (for example, two or three) of sub-pixels P in the pixel row 100.

Referring to FIGS. 11-12, the forward and reverse direction scan selection circuit 110 may include a forward and reverse direction scan selection output terminal 113 and a forward and reverse direction scan selection input terminal 114.

The forward and reverse direction scan selection output terminal 113 of the forward and reverse direction scan selection circuit 110 may be electrically connected to the pixel circuit 120.

Along the first direction X, the scan signal output terminal OUT of the (m+1)-th shift register unit 10 and the scan signal output terminal OUT of the (m−1)-th shift register unit 10 may be both electrically connected to the forward and reverse direction scan selection input terminal 114 of the forward and reverse direction scan selection circuit 110.

That is, for single pixel circuit 120, the scan signal SCAN outputted from the (m−1)-th shift register unit 10 or the (m+1)-th shift register unit 10 may be selectively received by the forward and reverse direction scan selection circuit 110.

In one embodiment, the forward and reverse direction scan selection output terminal 113 may be electrically connected to the pixel circuit 120, and the forward and reverse direction scan selection input terminal 114 may be electrically connected to the scan signal output terminals OUT of the (m+1)-th shift register unit 10 and the (m−1)-th shift register unit 10 arranged along the first direction X. Therefore, the pixel circuit 120 may be cooperated with the gate drive circuit 1, and the pixel circuit 120 may be adapted to the forward direction scan mode and the reverse direction scan mode of the gate drive circuit 1.

It should be noted that the scan signal SCAN outputted through the scan signal output terminal OUT may control the pixel circuit 120, for example, control the pixel circuit 120 to enter the initialization stage, or control the data signal to be written into the pixel circuit 120, and also realize compensation control of the threshold voltage of the transistor.

Figure 14:
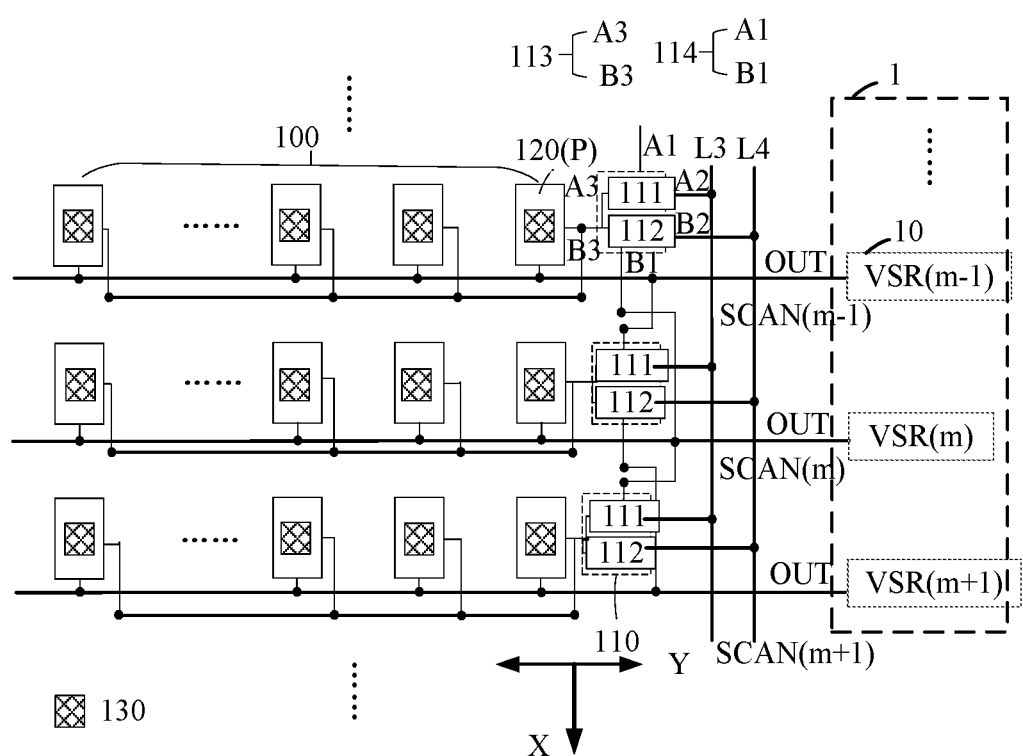
FIG. 14 illustrates another optional circuit structural schematic of a display panel according to various embodiments of the present disclosure.

Referring to FIGS. 13-14, FIG. 14 illustrates an optional circuit structural schematic of the forward and reverse direction scan selection circuit 110, the pixel circuit 120 and the gate drive circuit 1 in the display panel of embodiment of the present disclosure. In one embodiment, the forward and reverse direction scan selection circuit 110 may include the first scan selection unit 111 and the second scan selection unit 112.

The first scan selection unit 111 may include the first scan input terminal A1, the first scan control terminal A2 and the first scan output terminal A3; and the second scan selection unit 112 may include the second scan input terminal B1, the second scan control terminal B2 and the second scan output terminal B3.

Both the first scan input terminal A1 and the second scan input terminal B1 may be configured to connect the scan signal SCAN from the shift register unit 10. The first scan output terminal A3 and the second scan output terminal B3 may be the output terminals of the forward and reverse direction scan selection circuit 110. That is, the forward and reverse direction scan selection output terminal 113 may include the first scan output terminal A3 and the second scan output terminal B3; and the first scan output terminal A3 may be electrically connected to the second scan output terminal B3.

Above-mentioned first scan input terminal A1 may be electrically connected to the scan signal output terminal OUT of the (m−1)-th shift register unit 10 arranged along the first direction X; and above-mentioned second scan input terminal B1 may be electrically connected to the scan signal output terminal OUT of the (m+1)-th shift register unit 10 arranged along the first direction X.

The first scan selection unit 111 and the second scan selection unit 112 may be configured as that the scan signal SCAN connected to the first scan input terminal A1 or the second scan input terminal B1 in the forward and reverse direction scan selection circuit 110 may be selectively outputted to the pixel circuit 120 through the forward and reverse direction scan selection output terminal 113.

Above first scan control terminal A2 may be electrically connected to the first control signal line L3, and above second scan control terminal B2 may be electrically connected to the second control signal line L4.

Above-mentioned first control signal line L3 may write the low-stage or high-level signal into the first scan control terminal A2, thereby controlling the first scan selection unit 111 in the forward and reverse direction scan selection circuit 110 to be turned on or turned off. Above-mentioned second control signal line L4 may write the low-stage or high-level signal into the second scan control terminal B2, thereby controlling the second scan selection unit 112 in the forward and reverse direction scan selection circuit 110 to be turned on or turned off.

In one embodiment, the first scan control terminal A2 may be electrically connected to the first control signal line L3, the first scan input terminal A1 may be electrically connected to the scan signal output terminal OUT of the (m−1)-th shift register unit 10 arranged along the first direction X, the second scan control terminal B2 may be electrically connected to the second control signal line L4, and the second scan input terminal B1 may be electrically connected to the scan signal output terminal OUT of the (m+1)-th shift register unit 10 arranged along the first direction X. Therefore, one of the first scan selection unit 111 and the second scan selection unit 112 may be selected to be turned on according to the signals connected to the first scan control terminal A2 and the second scan control terminal B2, such that the forward and reverse direction scan selection circuit 110 may selectively output the scan signal SCAN outputted from the m−1 shift register unit 10 or the (m+1)-th shift register unit 10 to the pixel circuit 120.

In some embodiments, the first scan selection unit 111 and the second scan selection unit 112 may be configured in the forward and reverse direction scan selection circuit 110; and corresponding scan input terminal, scan control terminal and scan output may be configured for each scan selection unit terminal. Therefore, detailed connection structure between the forward and reverse direction scan selection circuit 110, the pixel circuit 120 and the gate drive circuit 1 may be provided. An optional implementation solution may be provided for the pixel circuit 120 to be adapted to the forward or reverse direction scan mode of the gate drive circuit 1, which may improve functional diversity of the display panel.

Referring to FIGS. 13-14, in some optional embodiments, the pixel circuit 120 may include a drive transistor 141 and a first initialization circuit 142.

The output terminal of the first initialization circuit 142 may be electrically connected to the control electrode of the drive transistor 141. The control terminal of the first initialization circuit 142 may be electrically connected with the first scan output terminal A3 and the second scan output terminal B3.

Above-mentioned drive transistor 141 may be configured to provide a drive current for the light-emitting element 130 in the sub-pixel P; and when above-mentioned first initialization circuit 142 is turned on, the gate electrode of the drive transistor 141 may be connected to the reset voltage signal Vref, and the pixel circuit 120 may enter the initialization stage.

In some embodiments, the control terminal of the first initialization circuit 142 in the pixel circuit 120 may be electrically connected to the first scan output terminal A3 and the second scan output terminal B3, such that the forward and reverse direction scan selection circuit 110 may input the scan signal SCAN connected from the (m+1)-th shift register unit 10 or (m−1)-th shift register unit 10 arranged along the first direction X to the pixel circuit 120. The control terminal of the first initialization circuit 142 in the pixel circuit 120 may be connected to the scan signal outputted from the shift register unit 10, which may control the pixel circuit 120 to enter the initialization stage. Therefore, the pixel circuit 120 may be adapted to the forward direction scan mode and the reverse direction scan mode of the gate drive circuit 1.

When the scan signal SCAN outputted from the (m+1)-th shift register unit 10 or the (m−1)-th shift register unit 10 arranged along the first direction X is inputted to the control terminal of the first initialization circuit 142, the first initialization circuit 142 in the pixel circuit 120 may be turned on, the gate electrode of the drive transistor 141 may be connected to the reset voltage signal Vref for initialization, and the pixel circuit 120 may enter the initialization stage.

In some embodiments, the circuit connection relationship between the drive transistor 141 and the first initialization circuit 142 inside the pixel circuit 120 may be provided; and the connection structure design between the first initialization circuit 142 and the forward and reverse direction scan selection circuit 110 in the pixel circuit 120 may also be provided. In such way, the gate drive circuit 1 may use the scan signal SCAN outputted from different shift register units 10 to realize the initialization control of the drive transistor 141 in both forward and reverse direction scan modes, which ensures that the pixel circuit 120 in the display panel may smoothly enter the initialization stage. Therefore, the display panel may be adapted to forward scan and reverse scan, and the applicability of the display panel may be improved.

Figure 15:
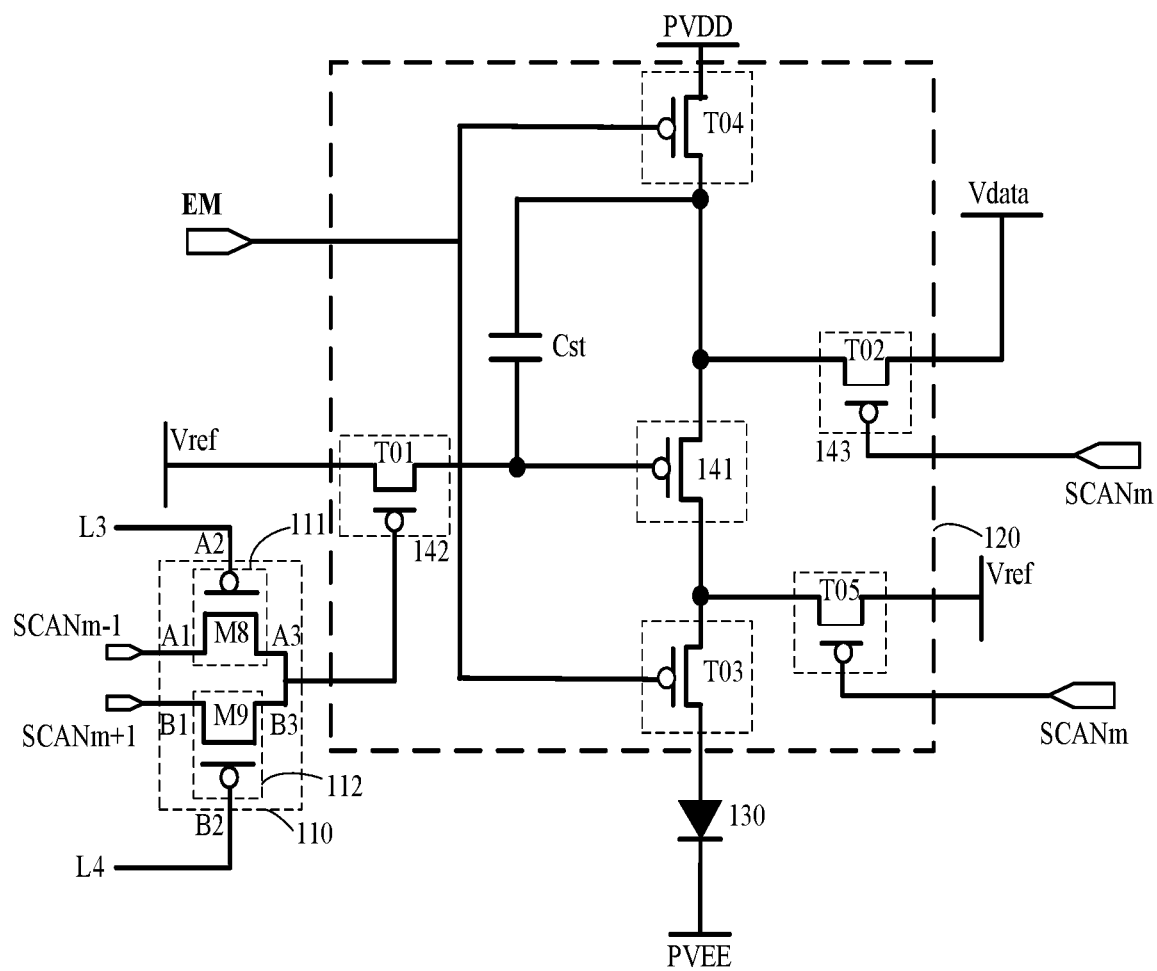
FIG. 15 illustrates an optional circuit structural schematic of a pixel circuit in a display panel according to various embodiments of the present disclosure.
Figure 16:
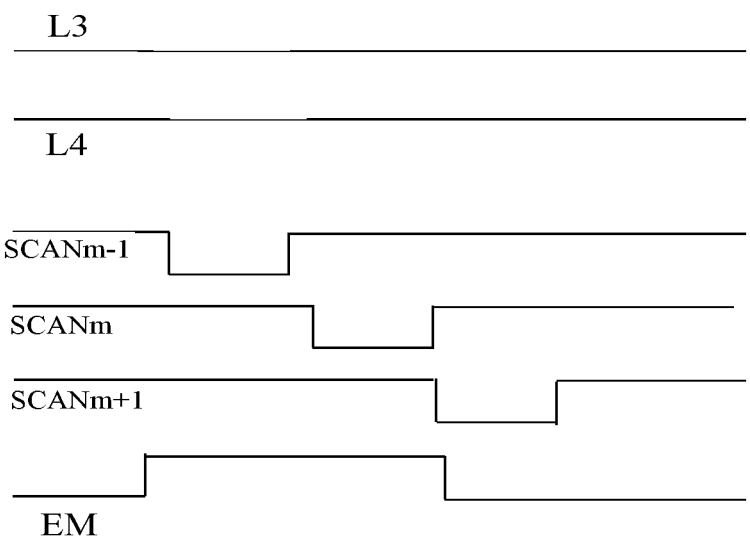
FIG. 16 illustrates a time sequence diagram of signals involved in a pixel circuit when a gate drive circuit in a display panel operates in a forward direction scan mode according to various embodiments of the present disclosure.
Figure 17:
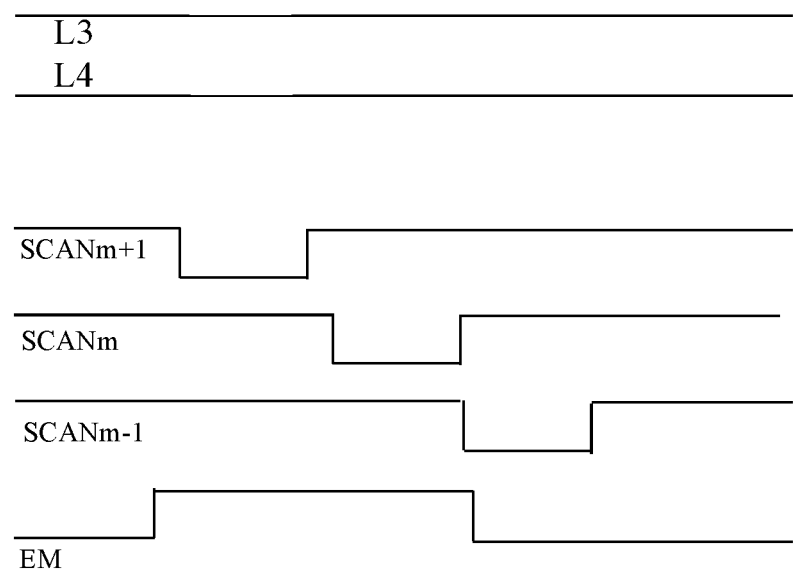
FIG. 17 illustrates a time sequence diagram of signals involved in a pixel circuit when a gate drive circuit in a display panel operates in a reverse direction scan mode according to various embodiments of the present disclosure.

It should be noted that, referring to FIGS. 13-15, the first initialization circuit 142 in above pixel circuit 120 may include the first initialization transistor T01. In addition, the pixel circuit 120 may further include a data write circuit 143, a first light-emitting control transistor T03, a second light-emitting control transistor T04 and a second initialization transistor T05.

The data write circuit 143 may include a data write transistor T02. The data write transistor T02 may be electrically connected to the first electrode of the drive transistor 141 and a data signal line. When the data write transistor T02 is turned on, the gate electrode of the drive transistor 141 may be controlled to write the data signal Vdata, such that the pixel circuit 120 may enter the data write stage.

The first light-emitting control transistor T03 and the second light-emitting control transistor T04 may be configured between an anode of the light-emitting element 130 and a power signal line PVDD; the control electrodes of the first light-emitting control transistor T03 and the second light-emitting control transistor T04 may be electrically connected to a light-emitting control signal line EM; and the first light-emitting control transistor T03 and the second light-emitting control transistor T04 may control the light-emitting element 130 to enter a light-emitting stage.

The control electrode of the second initialization transistor T05 may be electrically connected to the scan signal output terminal OUT of the m-th shift register unit 10 arranged along the first direction X and may be turned on when receiving the low-level signal, such that the reset voltage signal Vref may initialize the anode of the light-emitting element 130.

In other embodiments, the first initialization circuit 142 and other circuits or circuits in the pixel circuit 120 may also be configured with reference to the pixel circuit 120 in the existing technology, which may not be described in detail herein.

Referring to FIGS. 1, 3, 6, 9 and 11-16, in the display panel provided in embodiments of the present disclosure, when the gate drive circuit 1 operates in the forward direction scan mode, the first scan selection unit 111 may be turned on in response to the enable signal outputted from the first control signal line L3, and the second scan selection unit 112 may be turned off in response to the disenable signal outputted from the second control signal line L4.

It should be noted that, in exemplary display panel provided in embodiment of the present disclosure, the thin film transistors in the gate drive circuit 1 and the pixel circuit 120 may be all P-type transistors for illustration. At this point, the enable signal may be the low-level signal, and the disenable signal may be the high-level signal.

In the forward direction scan mode, the first control signal line L3 may transmit the enable signal to the control terminal of the first scan selection unit 111, such that the first scan selection unit 111 may be turned on. Therefore, the first scan selection unit 111 may output the scan signal SCAN outputted from the (m−1)-th shift register unit 10 arranged along the first direction X connected to the first scan input terminal A1 to the control terminal of the first initialization circuit 142.

On the contrary, the second control signal line L4 may transmit the disenable signal to the control terminal of the second scan selection unit 112, such that the second scan selection unit 112 may be turned off.

In some embodiments, different signals may be applied to the control terminal of the first scan selection unit 111 and the control terminal of the second scan selection unit 112, such that the first scan selection unit 111 may be turned on when the gate drive circuit 1 operates in the forward direction scan mode. Furthermore, the scan signal SCAN outputted from the scan signal output terminal OUT of the (m−1)-th shift register unit 10 may be inputted to the control terminal of the first initialization circuit 142, such that the pixel circuit 120 may enter the initialization stage. Therefore, normal initialization of the drive transistor 141 of each pixel circuit 120 may be ensured when the gate drive circuit 1 operates in the forward direction scan mode.

Subsequently, at next period, combined with the scan signal output terminal OUT of the m-th shift register unit 10 arranged along the first direction X, the data write circuit 143 in the pixel circuit 120 may be normally controlled to be turned on, such that data write may be realized by the drive transistor 141. Therefore, normal operation of the pixel circuit 120 in the display panel may be ensured when the gate drive circuit 1 operates in the forward direction scan mode.

Referring to FIGS. 1, 3, 7, 9, 11-14 and 17, when the gate drive circuit 1 operates in the reverse direction scan mode, the first scan selection unit 111 may be turned off in response to the disenable signal outputted from the first control signal line L3, and the second scan selection unit 112 may be turned on in response to the enable signal outputted from the second control signal line L4.

That is, in the reverse direction scan mode, the second control signal line L4 may transmit the enable signal to the control terminal of the second scan selection unit 112, and the second scan selection unit 112 may be turned on. Therefore, the second scan selection unit 112 may output the scan signal SCAN outputted from the (m+1)-th shift register unit 10 along the first direction X, which is connected to the second scan input terminal B1, to the control terminal of the first initialization circuit 142.

On the contrary, the first control signal line L3 may transmit the disenable signal to the control terminal of the first scan selection unit 111, and the first scan selection unit 111 may be turned off.

In some embodiments, different signals may be applied to the control terminal of the first scan selection unit 111 and the control terminal of the second scan selection unit 112, such that the second scan selection unit 112 may be turned on when the gate drive circuit 1 operates in the reverse direction scan mode. Furthermore, the scan signal SCAN outputted from the scan signal output terminal OUT of the (m+1)-th shift register unit 10 may be transmitted to the control terminal of the first initialization circuit 142, such that the pixel circuit 120 may enter the initialization stage. Therefore, normal initialization of the drive transistor 141 of each pixel circuit 120 may be ensured when the gate drive circuit 1 operates in the reverse direction scan mode.

Subsequently, at next period, combined with the scan signal output terminal OUT of the m-th shift register unit 10 arranged along the first direction X, the data write circuit 143 in the pixel circuit 120 may be normally controlled to be turned on, such that data write may be realized by the drive transistor 141. Therefore, normal operation of the pixel circuit 120 in the display panel may be ensured when the gate drive circuit 1 operates in the reverse direction scan mode.

Figure 18:
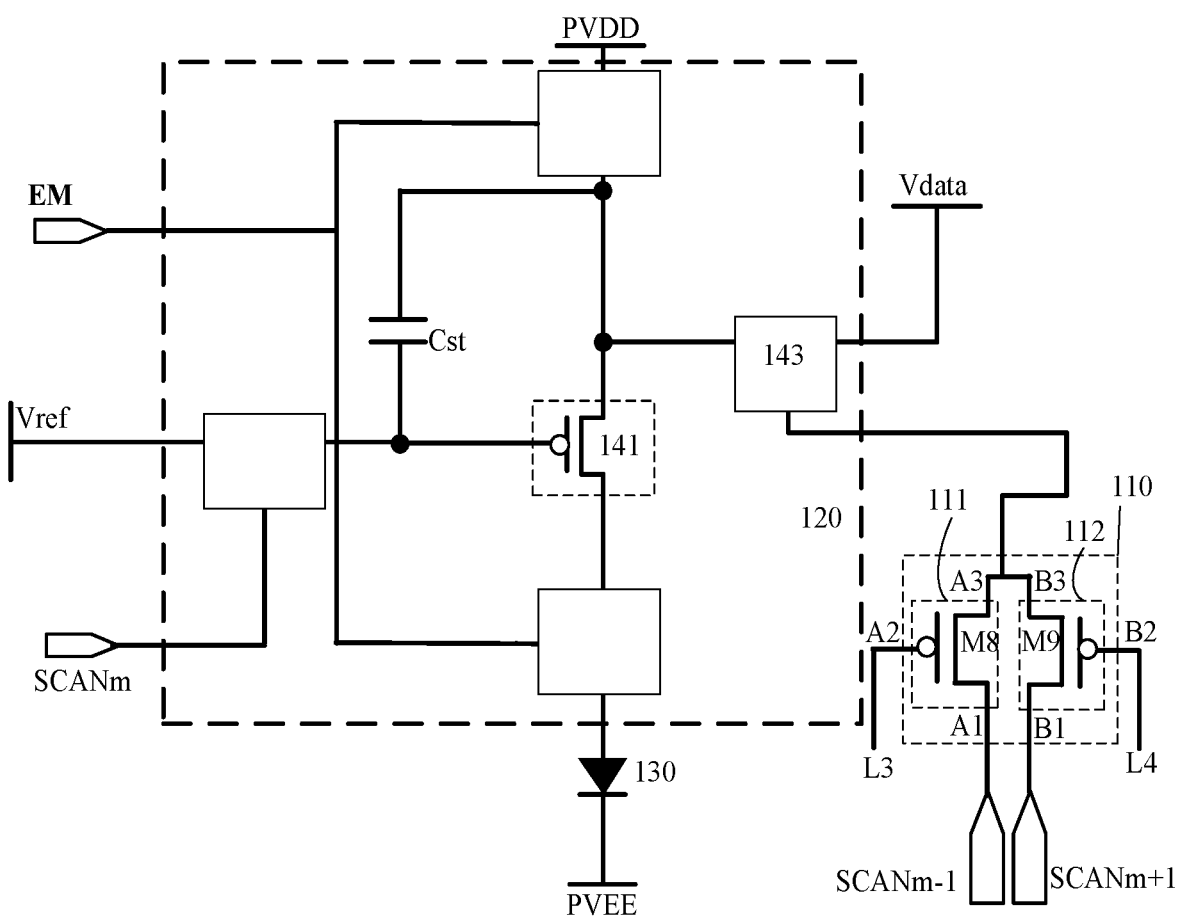
FIG. 18 illustrates a circuit structural schematic of a pixel circuit in a display panel according to various embodiments of the present disclosure.
Figure 19:
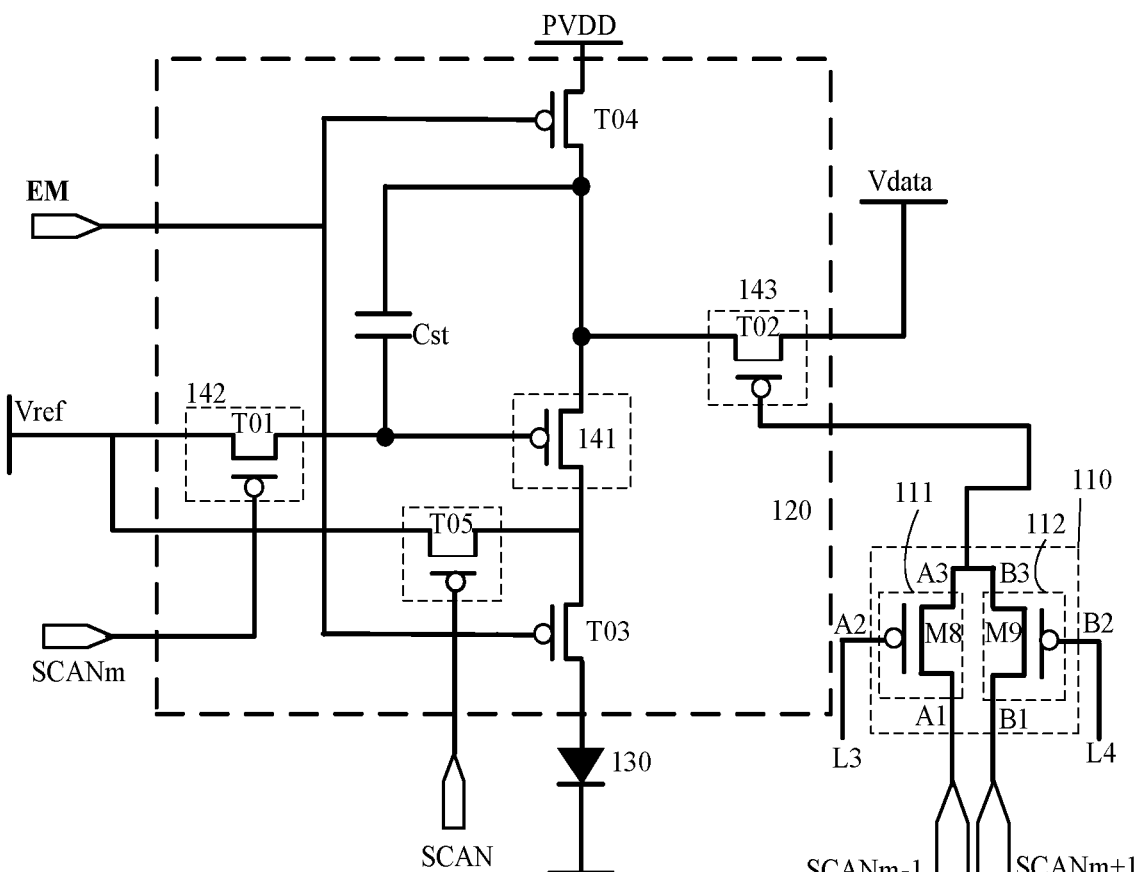
FIG. 19 illustrates a circuit structural schematic of a pixel circuit in a display panel according to various embodiments of the present disclosure.
Figure 20:
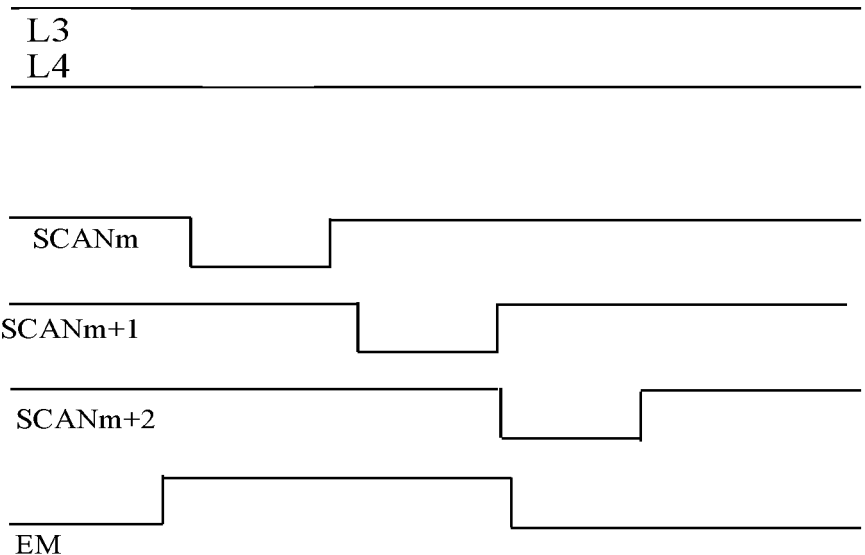
FIG. 20 illustrates another time sequence diagram of signals involved in a pixel circuit when a gate drive circuit in a display panel operates in a forward direction scan mode according to various embodiments of the present disclosure.
Figure 21:
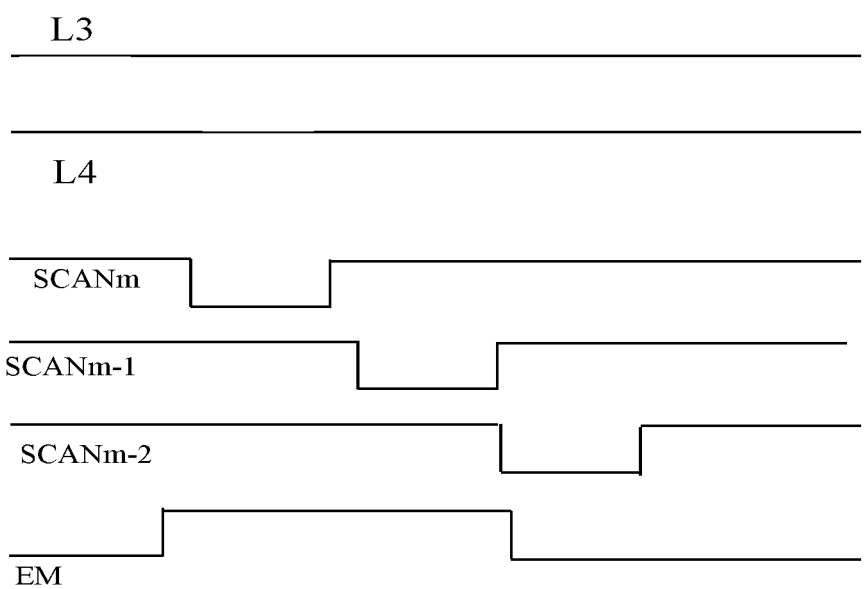
FIG. 21 illustrates another time sequence diagram of signals involved in a pixel circuit when a gate drive circuit in a display panel operates in a reverse direction scan mode according to various embodiments of the present disclosure.

Referring to FIGS. 13-14 and 18, above-mentioned pixel circuit 120 may include the drive transistor 141 and the data write circuit 143.

The output terminal of the data write circuit 143 may be electrically connected to the first electrode of the drive transistor 141. The control terminal of the data write circuit 143 may be electrically connected to the first scan output terminal A3 and the second scan output terminal B3.

Above drive transistor 141 may be configured to provide a drive current for the light-emitting element 130 in the sub-pixel P. When the data write circuit 143 is turned on, the gate electrode of the drive transistor 141 may write the data signal Vdata, and the pixel circuit 120 may enter the data write stage. Above-mentioned data write circuit 143 may be a data write transistor.

In some embodiments, the control terminal of the data write circuit 143 in the pixel circuit 120 may be electrically connected to the first scan output terminal A3 and the second scan output terminal B3. In such way, the forward and reverse direction scan selection circuit 110 may input the scan signal SCAN connected from the (m+1)-th shift register unit 10 or the (m−1)-th shift register unit 10 arranged along the first direction X to the pixel circuit 120. The control terminal of the data write circuit 143 in the pixel circuit 120 may be connected to the scan signal SCAN outputted from the shift register unit 10, which may control the pixel circuit 120 to enter the data write stage. Therefore, the pixel circuit 120 may be adapted to the forward direction scan mode and the reverse direction scan mode of the gate drive circuit 1.

When the scan signal SCAN outputted from the (m+1)-th shift register unit 10 or the (m−1)-th shift register unit 10 arranged along the first direction X is transmitted to the control terminal of the data write circuit 143, the data write circuit 143 in the pixel circuit 120 may be turned on, the data signal line may write the data signal Vdata to the gate electrode of the drive transistor 141 through the data write circuit 143, and the pixel circuit 120 may enter the data write stage.

In some embodiments, the circuit connection relationship between the drive transistor 141 and the data write circuit 143 inside the pixel circuit 120 may be provided, and the connection structure design between the data write circuit 143 and the forward and reverse direction scan selection circuit 110 in the pixel circuit 120 may be also provided. In such way, the gate drive circuit 1 may use the scan signal SCAN outputted from different shift register units 10 to realize the drive control of the pixel circuit 120 in both forward and reverse direction scan modes, which may ensure that the pixel circuit 120 in the display panel may enter the data write stage smoothly. Therefore, the display panel may be adapted to forward scan and reverse scan, and the applicability of the display panel may be improved.

It should be noted that, referring to FIGS. 14-19, the data write circuit 143 in above pixel circuit 120 may include a data write transistor T02. The data write transistor T02 may be electrically connected to the first electrode of the drive transistor 141 and the data signal line. When the data write transistor T02 is turned on, the gate electrode of the drive transistor 141 may be controlled to write the data signal Vdata, such that the pixel circuit 120 may enter the data write stage.

In addition, the pixel circuit 120 may further include the first light-emitting control transistor T03, the second light-emitting control transistor T04, the first initialization transistor T01 and the second initialization transistor T05.

The first light-emitting control transistor T03 and the second light-emitting control transistor T04 may be configured between the anode of the light-emitting element 130 and the power signal line PVDD; and the control electrodes of the first light-emitting control transistor T03 and the second light-emitting control transistor T04 may be electrically connected to the light-emitting control signal line EM.

When the control terminals of the first light-emitting control transistor T03 and the second light-emitting control transistor T04 are connected to a low-stage light-emitting control signal, the first light-emitting control transistor T03 and the second light-emitting control transistor T04 may be turned on, which may control the light-emitting element 130 to enter the light-emitting stage.

The output terminal of the first initialization transistor T01 may be electrically connected to the gate electrode of the drive transistor 141, and the control electrode of the first initialization transistor T01 may be electrically connected to the scan signal output terminal OUT of the m-th shift register unit 10 along the first direction X. When the scan signal output terminal OUT of the m-th shift register unit 10 outputs the low-stage scan signal SCAN, the first initialization transistor T01 may be turned on, the reset voltage signal Vref may initialize the gate electrode of the drive transistor, and the pixel circuit 120 may enter the initialization stage.

The output terminal of the second initialization transistor T05 may be electrically connected to the anode of the light-emitting element 130, and the control terminal of the second initialization transistor T05 may be electrically connected to the data write transistor T02, or the control terminal of the second initialization transistor T05 may also be electrically connected to the control terminal of the first initialization transistor T01. In some optional embodiments, the second initialization transistor T05 may also be controlled by an independent scan signal SCAN. The second initialization transistor T05 may be turned on when receiving the low-level signal, and the reset voltage signal Vref may initialize the anode of the light-emitting element 130.

In other embodiments, the data write circuit 143 and other circuits or circuits in the pixel circuit 120 may also be configured with reference to the pixel circuit 120 in the existing technology, which may not be described in detail herein.

Some optional embodiments may refer to FIGS. 1, 3, 6, 9, 11, 12, 14 and 18-20.

When the gate drive circuit 1 operates in the forward direction scan mode, the first scan selection unit 111 may be turned off in response to the disenable signal outputted from the first control signal line L3, and the second scan selection unit 112 may be turned on in response to the enable signal outputted from the second control signal line L4.

That is, in the forward direction scan mode, the second control signal line L4 may transmit the enable signal to the control terminal of the second scan selection unit 112, such that the second scan selection unit 112 may be turned on. Therefore, the second scan selection unit 112 may output the scan signal SCAN outputted from the (m+1)-th shift register unit 10 along the first direction X, which is connected to the second scan input terminal B1, to the control terminal of the data write circuit 143.

On the contrary, the first control signal line L3 may transmit the disenable signal to the control terminal of the first scan selection unit 111, and the first scan selection unit 111 may be turned off.

In some embodiments, different signals may be applied to the control terminal of the first scan selection unit 111 and the control terminal of the second scan selection unit 112, such that the second scan selection unit 112 may be turned on when the gate drive circuit 1 operates in the forward direction scan mode. Furthermore, the scan signal SCAN outputted from the scan signal output terminal OUT of the (m+1)-th shift register unit 10 may be inputted to the control terminal of the data write circuit 143, such that the pixel circuit 120 may enter the data write stage. Therefore, normal write of data in each pixel circuit 120 may be ensured when the gate drive circuit 1 operates in the forward direction scan mode.

Combined with the initialization control of the first initialization circuit 142 in the current pixel circuit 120 by the scan signal output terminal OUT of the m-th shift register unit 10 along the first direction X before the second scan selection unit 112 is turned on, the drive transistor 141 may be initialized. Therefore, normal operation of the pixel circuit 120 in the display panel may be ensured when the gate drive circuit 1 operates in the forward direction scan mode.

Some optional embodiments may refer to FIGS. 1, 3, 7, 9, 11, 12, 14, 18-19 and 21.

When the gate drive circuit 1 operates in the reverse direction scan mode, the first scan selection unit 111 may be turned on in response to the enable signal outputted from the first control signal line L3, and the second scan selection unit 112 may be turned off in response to the disenable signal outputted from the second control signal line L4.

In the reverse direction scan mode, the first control signal line L3 may transmit the enable signal to the control terminal of the first scan selection unit 111, such that the first scan selection unit 111 may be turned on. Therefore, the first scan selection unit 111 may output the scan signal SCAN outputted from the (m−1)-th shift register unit 10 along the first direction X, which is connected to the first scan input terminal A1, to the control terminal of the data write circuit 143.

On the contrary, the second control signal line L4 may transmit the disenable signal to the control terminal of the second scan selection unit 112, and the second scan selection unit 112 may be turned off.

In some embodiments, different signals may be applied to the control terminal of the first scan selection unit 111 and the control terminal of the second scan selection unit 112, such that the first scan selection unit 111 may be turned on when the gate drive circuit 1 operates in the reverse direction scan mode. Furthermore, the scan signal SCAN outputted from the scan signal output terminal OUT of the (m−1)-th shift register unit 10 may be inputted to the control terminal of the data write circuit 143, such that the pixel circuit 120 may enter the data write stage. Therefore, normal write of data in each pixel circuit 120 may be ensured when the gate drive circuit 1 operates in the reverse direction scan mode.

Combined with the initialization control of the first initialization circuit 142 in the current pixel circuit 120 by the scan signal output terminal OUT of the m-th shift register unit 10 along the first direction X before the second scan selection unit 112 is turned on, the drive transistor 141 may be initialized. Therefore, normal operation of the pixel circuit 120 in the display panel may be ensured when the gate drive circuit 1 operates in the reverse direction scan mode.

Figure 22:
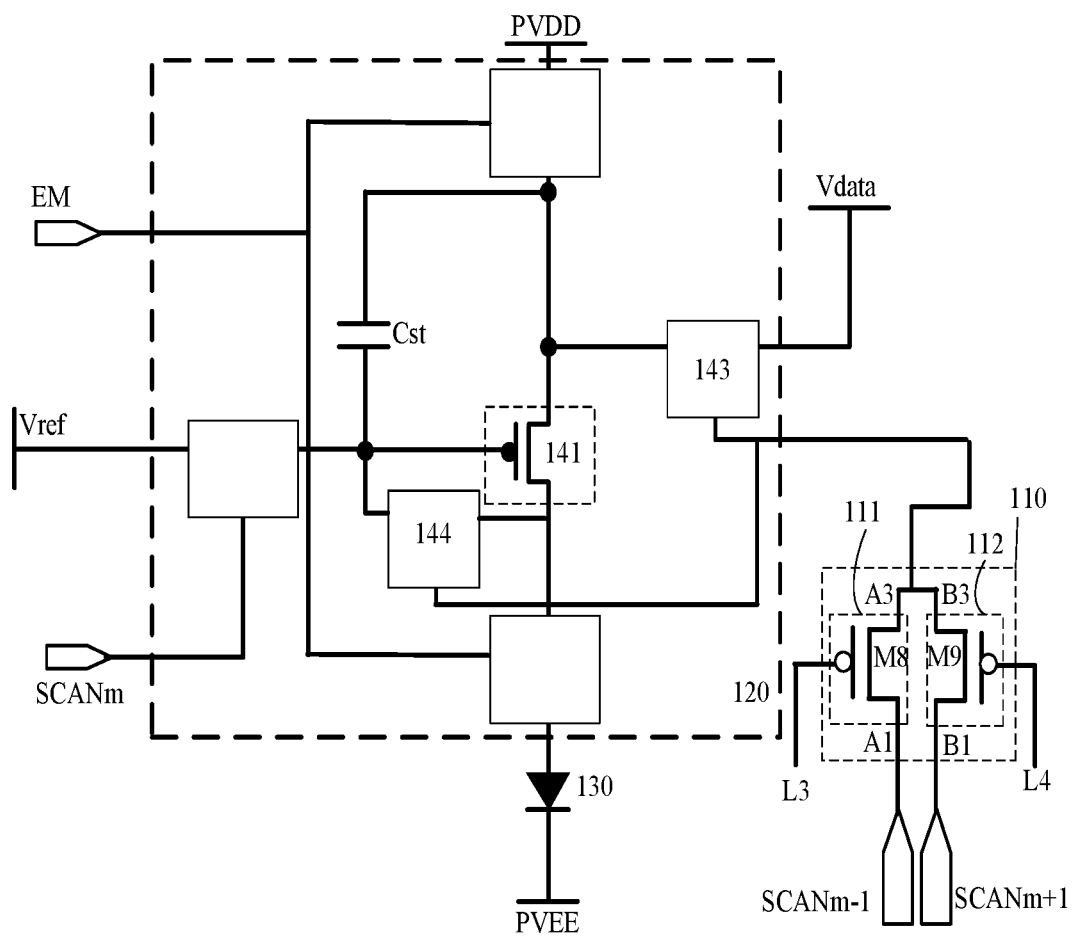
FIG. 22 illustrates another circuit structural schematic of a pixel circuit in a display panel according to various embodiments of the present disclosure.

Referring to FIGS. 13-14 and 22, in some optional embodiments, the pixel circuit 120 may include the drive transistor 141, the data write circuit 143 and a threshold compensation circuit 144.

The output terminal of the data write circuit 143 may be electrically connected to the first electrode of the drive transistor 141.

The control terminal of the data write circuit 143 may be electrically connected to the first scan output terminal A3 and the second scan output terminal B3.

The input terminal of the threshold compensation circuit 144 may be electrically connected to the second electrode of the drive transistor 141, and the output terminal of the threshold compensation circuit 144 may be electrically connected to the control electrode of the drive transistor 141.

The control terminal of the threshold compensation circuit 144 may be electrically connected to the first scan output terminal A3 and the second scan output terminal B3.

Above drive transistor 141 may be configured to provide a drive current for the light-emitting element 130 in the sub-pixel P. Exemplarily, the first terminal of the drive transistor 141 may be the source electrode of the drive transistor 141, the second terminal of the drive transistor 141 may be the drain electrode of the drive transistor 141, and the control terminal may be the gate electrode of the drive transistor 141.

When the data write circuit 143 is turned on, the gate electrode of the drive transistor 141 may write the data signal Vdata, and the pixel circuit 120 may enter the data write stage. Above-mentioned data write circuit 143 may be a data write transistor.

Above-mentioned threshold compensation circuit 144 may be configured to compensate the threshold voltage of the drive transistor 141. Exemplarily, the threshold compensation circuit 144 may be a threshold compensation transistor or any other suitable transistors.

In some embodiments, the control terminal of the data write circuit 143 in the pixel circuit 120 and the control terminal of the threshold compensation circuit 144 may be electrically connected to the first scan output terminal A3 and the second scan output terminal B3. Therefore, the forward and reverse direction scan selection circuit 110 may input the scan signal SCAN connected from the (m+1)-th shift register unit 10 or the (m−1)-th shift register unit 10 arranged along the first direction X to the pixel circuit 120. The control terminal of the data write circuit 143 of the pixel circuit 120 and the control terminal of the threshold compensation circuit 144 may be connected to the scan signal SCAN outputted from the shift register unit 10, which may control the drive transistor 141 in the pixel circuit 120 to write data, and the pixel circuit 120 may enter the data write stage. Meanwhile, the threshold compensation circuit 144 may also compensate the threshold voltage of the drive transistor 141, thereby ensuring operation stability of the drive transistor 141.

In some embodiments, the circuit connection relationship of the drive transistor 141, the data write circuit 143 and the threshold compensation circuit 144 inside the pixel circuit 120 may be provided, and the connection structure design of the data write circuit 143, the threshold compensation circuit 144 and the forward and reverse direction scan selection circuit 110 in the pixel circuit 120 may be also provided. Therefore, the gate drive circuit 1 may realize the drive control of the pixel circuit 120 by using the scan signal SCAN outputted from different shift register units 10, which ensures that the pixel circuit 120 in the display panel may enter the data write stage smoothly. In such way, the display panel may be adapted to forward scan and reverse scan, and the applicability of the display panel may be improved. Furthermore, the connection design of the threshold compensation circuit 144 and the forward and reverse direction scan selection circuit 110 may make the forward/reverse scan compatible design of the gate drive circuit 1 to be adaptable to various types of pixel circuits 120 and ensure operation stability of the drive transistor 141 during the data write process.

Figure 23:
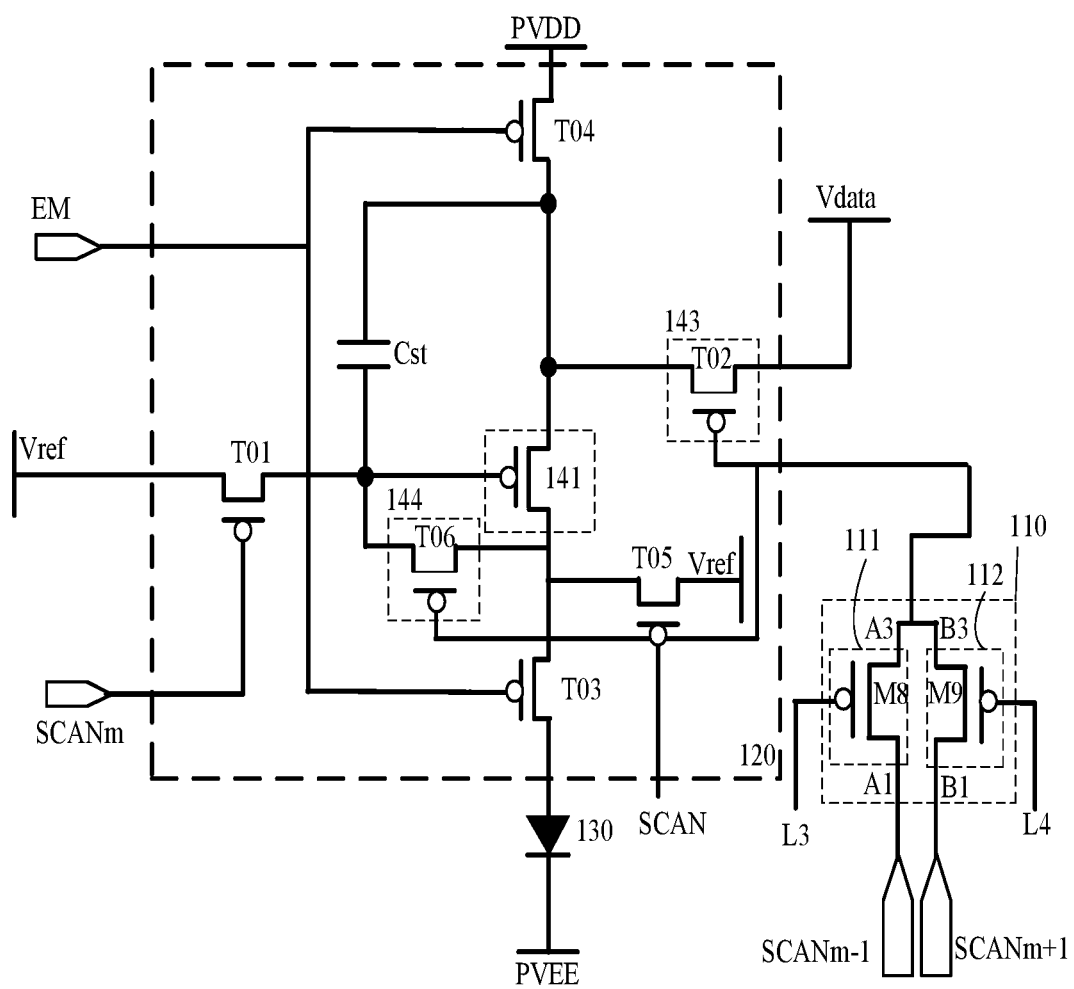
FIG. 23 illustrates another circuit structural schematic of a pixel circuit in a display panel according to various embodiments of the present disclosure.
Figure 24:
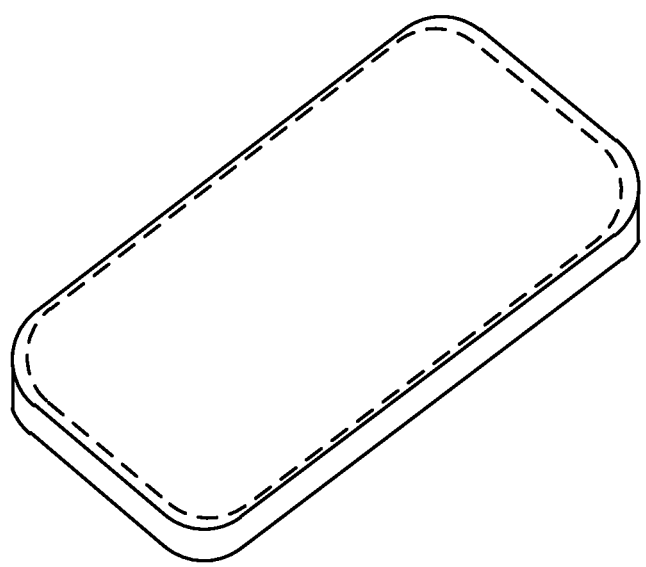
FIG. 24 illustrates a structural schematic of a display apparatus according to various embodiments of the present disclosure.

It should be noted that, referring to FIGS. 14 and 22-23, the data write circuit 143 in above pixel circuit 120 may include the data write transistor T02. The data write transistor T02 may be electrically connected to the first electrode of the drive transistor 141 and the data signal line. When the data write transistor T02 is turned on, the gate electrode of the drive transistor 141 may be controlled to write the data signal Vdata, such that the pixel circuit 120 may enter the data write stage.

The threshold compensation circuit 144 may include a threshold compensation transistor T06 which is electrically connected to the second terminal and the gate electrode of the drive transistor 141. When the threshold compensation transistor T06 is turned on, the threshold voltage of the drive transistor 141 may be compensated.

In addition, the pixel circuit 120 may further include the first light-emitting control transistor T03, the second light-emitting control transistor T04, the first initialization transistor T01 and the second initialization transistor T05.

The first light-emitting control transistor T03 and the second light-emitting control transistor T04 may be configured between the anode of the light-emitting element 130 and the power signal line PVDD; and the control electrodes of the first light-emitting control transistor T03 and the second light-emitting control transistor T04 may be electrically connected to the light-emitting control signal line EM. When the control terminals of the first light-emitting control transistor T03 and the second light-emitting control transistor T04 are connected to a low-stage light-emitting control signal, the first light-emitting control transistor T03 and the second light-emitting control transistor T04 may be turned on, which may control the light-emitting element 130 to enter the light-emitting stage.

The output terminal of the first initialization transistor T01 may be electrically connected to the gate electrode of the drive transistor 141; and the control electrode of the first initialization transistor T01 may be electrically connected to the scan signal output terminal OUT of the m-th shift register unit 10 along the first direction X. When the scan signal output terminal OUT of the m-th shift register unit 10 outputs the low-stage scan signal SCAN, the first initialization transistor T01 may be turned on, the reset voltage signal Vref may initialize the gate electrode of the drive transistor, and the pixel circuit 120 may enter the initialization stage.

The output terminal of the second initialization transistor T05 may be electrically connected to the anode of the light-emitting element 130, the second initialization transistor T05 may be turned on when receiving the low-level signal, and the reset voltage signal Vref may initialize the anode of the light-emitting element 130.

In other embodiments, the data write circuit 143, the threshold compensation circuit 144, and other circuits or circuits in the pixel circuit 120 may also be configured with reference to the pixel circuit 120 in the existing technology, which may not be described in detail herein.

Referring to FIGS. 1, 3, 6, 9, 11, 12, 14, 20-23, in some optional embodiments, when the gate drive circuit 1 operates in the forward direction scan mode, the first scan selection unit 111 may be turned off in response to the disenable signal outputted from the first control signal line L3, and the second scan selection unit 112 may be turned on in response to the enable signal outputted from the second control signal line L4.

That is, in the forward direction scan mode, the second control signal line L4 may transmit the enable signal to the control terminal of the second scan selection unit 112, such that the second scan selection unit 112 may be turned on. Therefore, the second scan selection unit 112 may output the scan signal SCAN outputted from the (m+1)-th shift register unit 10 along the first direction X, which is connected to the second scan input terminal B1, to the control terminal of the data write circuit 143 and the control terminal of the threshold compensation circuit 144.

On the contrary, the first control signal line L3 may transmit the disenable signal to the control terminal of the first scan selection unit 111, and the first scan selection unit 111 may be turned off.

In some embodiments, different signals may be applied to the control terminal of the first scan selection unit 111 and the control terminal of the second scan selection unit 112, such that the second scan selection unit 112 may be turned on when the gate drive circuit 1 operates in the forward direction scan mode. Furthermore, the scan signal SCAN outputted from the scan signal output terminal OUT of the (m+1)-th shift register unit 10 may be inputted to the control terminal of the data write circuit 143 and the control terminal of the threshold compensation circuit 144. Therefore, the pixel circuits 120 may enter the data write stage, thereby ensuring normal data write of each pixel circuit 120 when the gate drive circuit 1 operates in the forward direction scan mode. Meanwhile, the threshold compensation circuit 144 may be turned on, which may ensure stable operation of the drive transistor 141.

Combined with the initialization control of the first initialization circuit 142 in the current pixel circuit 120 by the scan signal output terminal OUT of the m-th shift register unit 10 along the first direction X before the second scan selection unit 112 is turned on, the drive transistor 141 may be initialized. Therefore, normal operation of the pixel circuit 120 in the display panel may be ensured when the gate drive circuit 1 operates in the forward direction scan mode.

Referring to FIGS. 1, 3, 7, 9, 11, 12, 14 and 20-23, in some optional embodiments, when the gate drive circuit 1 operates in the reverse direction scan mode, the first scan selection unit 111 may be turned on in response to the enable signal outputted from the first control signal line L3, and the second scan selection unit 112 may be turned off in response to the disenable signal outputted from the second control signal line L4.

That is, in the reverse direction scan mode, the first control signal line L3 may transmit the enable signal to the control terminal of the first scan selection unit 111, such that the first scan selection unit 111 may be turned on. Therefore, the first scan selection unit 111 may output the scan signal SCAN outputted from the (m−1)-th shift register unit 10 along the first direction X, which is connected to the first scan input terminal A1, to the control terminal of the data write circuit 143 and the control terminal of the threshold compensation circuit 144.

On the contrary, the second control signal line L4 may transmit the disenable signal to the control terminal of the second scan selection unit 112, and the second scan selection unit 112 may be turned off.

In some embodiments, different signals may be applied to the control terminal of the first scan selection unit 111 and the control terminal of the second scan selection unit 112, such that the first scan selection unit 111 may be turned on when the gate drive circuit 1 operates in the reverse direction scan mode. Furthermore, the scan signal SCAN outputted from the scan signal output terminal OUT of the (m−1)-th shift register unit 10 may be inputted to the control terminal of the data write circuit 143 and the control terminal of the threshold compensation circuit 144, such that the pixel circuit 120 may enter the data write stage. Therefore, normal data write of each pixel circuit 120 may be ensured when the gate drive circuit 1 operates in the reverse direction scan mode, and the stability of the drive transistor 141 in the pixel circuit 120 may also be ensured, such that the forward/reverse direction scan modes may be adapted to different types of pixel circuits 120.

Combined with the initialization control of the first initialization circuit 142 in the current pixel circuit 120 by the scan signal output terminal OUT of the m-th shift register unit 10 along the first direction X before the second scan selection unit 112 is turned on, the drive transistor 141 may be initialized. Therefore, normal operation of the pixel circuit 120 in the display panel may be ensured when the gate drive circuit 1 operates in the reverse direction scan mode.

Referring to FIGS. 11-15, 18, 19 and 22-23, the first scan selection unit 111 may include the first scan selection switch M8. The input terminal of the first scan selection switch M8 may be the first scan input terminal A1, the control terminal of the first scan selection switch M8 may be the first scan control terminal A2, and the output terminal of the first scan selection switch M8 may be the first scan output terminal A3.

The second scan selection unit 112 may include the second scan selection switch M9. The input terminal of the second scan selection switch M9 may be the second scan input terminal B1, the control terminal of the second scan selection switch M9 may be the second scan control terminal B2, and the output terminal of the second scan selection switch M9 may be the second scan output terminal B3.

Exemplarily, the scan signal output terminal OUT of the (m−1)-th shift register unit 10 along the first direction X may be electrically connected to the input terminal of the first scan selection switch M8; the output terminal of the first scan selection switch M8 may be electrically connected to the control terminal of the data write circuit 143 in the pixel circuit 120; and the output terminal of the first scan selection switch M8 may also be electrically connected to the control terminal of the threshold compensation circuit 144.

The scan signal output terminal OUT of the (m+1)-th shift register unit 10 along the first direction X may be electrically connected to the input terminal of the second scan selection switch M9; the output terminal of the second scan selection switch M9 may be electrically connected to the control terminal of the data write circuit 143 in the pixel circuit 120; and the output terminal of the second scan selection switch M9 may also be electrically connected to the control terminal of the threshold compensation circuit 144.

Or, in some other embodiments, the scan signal output terminal OUT of the (m−1)-th shift register unit 10 along the first direction X may be electrically connected to the input terminal of the first scan selection switch M8; and the output terminal of the first scan selection switch M8 may be electrically connected to the control terminal of the first initialization circuit 142 in the pixel circuit 120.

The scan signal output terminal OUT of the (m+1)-th shift register unit 10 along the first direction X may be electrically connected to the input terminal of the second scan selection switch M9; and the output terminal of the second scan selection switch M9 may be electrically connected to the control terminal of the first initialization circuit 142 in the pixel circuit 120.

The first scan selection switch M8 and the second scan selection switch M9 which are mentioned above may be thin film field effect transistors, and the types of the first scan selection switch M8 and the second scan selection switch M9 may be set according to actual needs. Exemplarily, both the first scan selection switch M8 and the second scan selection switch M9 may be P-type thin film field effect transistors.

Embodiments of the present disclosure also provide a display apparatus. Referring to 24, the display apparatus may be a PC, a TV, a monitor, a mobile terminal, a tablet computer, a wearable device and/or the like. The display apparatus may include the display panel provided in embodiments of the present disclosure.

From above-mentioned embodiments, it may be seen that the gate drive circuit, the display panel and the display apparatus provided by the present disclosure may achieve at least following beneficial effects.

Compared with the existing technology, for the gate drive circuit, the display panel and the display apparatus provided by embodiments of the present disclosure, the quantity n of shift register units may be configured to be arranged along the first direction in the gate drive circuit; the shift register unit may include the input circuit, the first node control circuit, the second node control circuit and the output control circuit; and the input circuit, the first node control circuit and the second node control circuit may be all electrically connected to the third node. Furthermore, along the first direction, control terminals of the input circuit of the m-th shift register unit may be respectively and electrically connected to the scan signal output terminal of the (m+1)-th shift register unit and the scan signal output terminal of the (m−1)-th shift register unit, where m∈n. Therefore, along the first direction, the input circuit of the shift register unit may simultaneously receive signal control of the scan signal output terminals of two adjacent shift register units, such that the gate drive circuit may be suitable for forward direction scan mode and reverse direction scan mode. Therefore, the gate drive control solution with at least two modes may be provided, which may be suitable for various requirements and improve compatibility of the display panel.

It should be noted that, in the present disclosure, the term "comprise", "include" or any other variation thereof may be intended to cover a non-exclusive inclusion. Therefore, a process, a method, an article or apparatus including a set of elements may include not only those elements, but also other elements not expressly listed, or also include elements inherent in the process, the method, the article or apparatus.

In the present disclosure, specific examples may be configured to illustrate the principle and implementation manners of the present disclosure, and the descriptions of above examples may be only configured to help understand the methods and core idea of the present disclosure. The above may only be optional embodiments of the present disclosure. It should be noted that due to the limitation of written expression, there may be unlimited specific structures. For those skilled in the art, on the premise of not departing from the principle of the present disclosure, certain improvements, modifications or changes may also be made, and above technical features may also be combined in an appropriate manner. These improvements, modifications, changes or combinations or direct application of the idea and technical solutions of the present disclosure to other occasions without improvement shall be regarded as the protection scope of the present disclosure.

What is claimed is:

1. A gate drive circuit, comprising:
a quantity n of shift register units arranged along a first direction, wherein:
   a shift register unit includes an input circuit, a first node control circuit, a second node control circuit and an output control circuit, wherein each of the input circuit, the first node control circuit and the second node control circuit is electrically connected to a third node; the first node control circuit is configured to control a stage of a first node; the second node control circuit is configured to control a stage of a second node; the output control circuit is electrically connected to each of a scan signal output terminal, the first node and the second node, and configured to control the scan signal output terminal to output a scan signal according to the stage of the first node and the stage of the second node;
   along the first direction, control terminals of an input circuit of an m-th shift register unit are electrically connected to a scan signal output terminal of an (m+1)-th shift register unit and a scan signal output terminal of an (m−1)-th shift register unit respectively, wherein m∈n;
   the input circuit includes a first input selection unit and a second input selection unit; the first input selection unit includes a first input terminal, a first output terminal and a first control terminal; and the second input selection unit includes a second input terminal, a second output terminal and a second control terminal;
   the first input terminal is electrically connected to a first signal line, and the first output terminal is electrically connected to the third node;
   the second input terminal is electrically connected to a second signal line, and the second output terminal is electrically connected to the third node; and
   along the first direction, a first control terminal of the m-th shift register unit is electrically connected to the scan signal output terminal of the (m+1)-th shift register unit; and a second control terminal of the m-th shift register unit is electrically connected to the scan signal output terminal of the (m−1)-th shift register unit; and
   when the gate drive circuit operates in a forward direction scan mode, the first signal line transmits a high-level signal, and the second signal line transmits a low-level signal.

2. The gate drive circuit according to claim 1, wherein:
along the first direction, a control terminal of an input circuit in a first shift register unit is electrically connected to a start transmission signal line; and a control terminal of an input circuit of an n-th shift register unit is electrically connected to the start transmission signal line.

3. The gate drive circuit according to claim 1, wherein:
when being operated in the forward direction scan mode, the gate drive circuit includes a first period and a second period;
at the first period, in the m-th shift register unit, the second control terminal is turned on in response to an enable signal outputted from the scan signal output terminal of the (m−1)-th shift register unit, and the first control terminal is turned off in response to the disenable signal outputted from the scan signal output terminal of the (m+1)-th shift register unit, such that the low-level signal is written into the first node; and
at the second period, in the m-th shift register unit, the second control terminal is turned off in response to the disenable signal outputted from the scan signal output terminal of the (m−1)-th shift register unit, and the first control terminal is turned on in response to the enable signal outputted from the scan signal output terminal of the (m+1)-th shift register unit, such that the high-level signal is written into the first node.

4. The gate drive circuit according to claim 1, wherein:
when the gate drive circuit operates in a reverse direction scan mode, the first signal line transmits a low-level signal, and the second signal line transmits a high-level signal.

5. The gate drive circuit according to claim 4, wherein:
when being operated in the reverse direction scan mode, the gate drive circuit includes a first period and a second period;
at the first period, in the m-th shift register unit, the first control terminal is turned on in response to the enable signal outputted from the scan signal output terminal of the (m+1)-th shift register unit, and the second control terminal is turned off in response to the disenable signal outputted from the scan signal output terminal of the (m−1)-th shift register unit, such that the low-level signal is written into the first node; and
at the second period, in the m-th shift register unit, the first control terminal is turned off in response to the disenable signal outputted from the scan signal output terminal of the (m+1)-th shift register unit, and the second control terminal is turned on in response to the enable signal outputted from the scan signal output terminal of the (m−1)-th shift register unit, such that the high-level signal is written into the first node.

6. The gate drive circuit according to claim 1, wherein:
the first input selection unit includes a first switch, wherein an input terminal of the first switch is the first input terminal, an output terminal of the first switch is the first output terminal, and a control terminal of the first switch is the first control terminal; and
the second input selection unit includes a second switch, wherein an input terminal of the second switch is the second input terminal, an output terminal of the second switch is the second output terminal, and a control terminal of the second switch is the second control terminal.

7. A display panel, comprising:
a gate drive circuit, comprising:
a quantity n of shift register units arranged along a first direction, wherein:
a shift register unit includes an input circuit, a first node control circuit, a second node control circuit and an output control circuit, wherein each of the input circuit, the first node control circuit and the second node control circuit is electrically connected to a third node; the first node control circuit is configured to control a stage of a first node; the second node control circuit is configured to control a stage of a second node; the output control circuit is electrically connected to each of a scan signal output terminal, the first node and the second node, and configured to control the scan signal output terminal to output a scan signal according to the stage of the first node and the stage of the second node;
along the first direction, control terminals of an input circuit of an m-th shift register unit are electrically connected to a scan signal output terminal of an (m+1)-th shift register unit and a scan signal output terminal of an (m−1)-th shift register unit respectively, wherein m∈n; and
the display panel further includes a plurality of forward and reverse direction scan selection circuits and a plurality of pixel rows, wherein:
a pixel row of the plurality of pixel rows includes a plurality of sub-pixels, and a sub-pixel of the plurality of sub-pixels includes a pixel circuit and a light-emitting element;
one forward and reverse direction scan selection circuit is electrically connected to at least one pixel circuit;
a forward and reverse direction scan selection circuit of the plurality of forward and reverse direction scan selection circuits includes a forward and reverse direction scan selection output terminal and a forward and reverse direction scan selection input terminal;
the forward and reverse direction scan selection output terminal of the forward and reverse direction scan selection circuit is electrically connected to the pixel circuit; and
along the first direction, both the scan signal output terminal of the (m+1)-th shift register unit and the scan signal output terminal of the (m−1)-th shift register unit are electrically connected to the forward and reverse direction scan selection input terminal of the forward and reverse direction scan selection circuit.

8. The display panel according to claim 7, wherein:
the forward and reverse direction scan selection circuit includes a first scan selection unit and a second scan selection unit; the first scan selection unit includes a first scan input terminal, a first scan control terminal and a first scan output terminal; the second scan selection unit includes a second scan input terminal, a second scan control terminal and a second scan output terminal; forward and reverse direction scan selection output terminals include a first scan output terminal and a second scan output terminal; the first scan output terminal is electrically connected to the second scan output terminal; and forward and reverse direction scan selection input terminals include a first scan input terminal and a second scan input terminal;
along the first direction, the scan signal output terminal of the (m−1)-th shift register unit is electrically connected to the first scan input terminal, and the scan signal output terminal of the (m+1)-th shift register unit is electrically connected to the second scan input terminal;
the first scan control terminal is electrically connected to a first control signal line; and
the second scan control terminal is electrically connected to a second control signal line.

9. The display panel according to claim 8, wherein:
the pixel circuit includes a drive transistor and a first initialization circuit;
an output terminal of the first initialization circuit is electrically connected to a control electrode of the drive transistor; and
a control terminal of the first initialization circuit is electrically connected to the first scan output terminal and the second scan output terminal.

10. The display panel according to claim 9, wherein:
when the gate drive circuit operates in a forward direction scan mode, the first scan selection unit is turned on in response to an enable signal outputted from the first control signal line, and the second scan selection unit is turned off in response to a disenable signal outputted from the second control signal line; or
when the gate drive circuit operates in a reverse direction scan mode, the first scan selection unit is turned off in response to a disenable signal outputted from the first control signal line, and the second scan selection unit is turned on in response to an enable signal outputted from the second control signal line.

11. The display panel according to claim 8, wherein:
the pixel circuit includes a drive transistor and a data write circuit;
an output terminal of the data write circuit is electrically connected to a first electrode of the drive transistor; and
a control terminal of the data write circuit is electrically connected to the first scan output terminal and the second scan output terminal.

12. The display panel according to claim 11, wherein:
when the gate drive circuit operates in a forward direction scan mode, the first scan selection unit is turned off in response to a disenable signal outputted from the first control signal line, and the second scan selection unit is turned on in response to an enable signal outputted from the second control signal line; or
when the gate drive circuit operates in a reverse direction scan mode, the first scan selection unit is turned on in response to an enable signal outputted from the first control signal line, and the second scan selection unit is turned off in response to a disenable signal outputted from the second control signal line.

13. The display panel according to claim 8, wherein:
the pixel circuit includes a drive transistor, a data write circuit and a threshold compensation circuit;
an output terminal of the data write circuit is electrically connected to a first electrode of the drive transistor;
a control terminal of the data write circuit is electrically connected to the first scan output terminal and the second scan output terminal;
an input terminal of the threshold compensation circuit is electrically connected to a second electrode of the drive transistor, and an output terminal of the threshold compensation circuit is electrically connected to a control terminal of the drive transistor; and
a control terminal of the threshold compensation circuit is electrically connected to the first scan output terminal and the second scan output terminal.

14. The display panel according to claim 13, wherein:
when the gate drive circuit operates in a forward direction scan mode, the first scan selection unit is turned off in response to a disenable signal outputted from the first control signal line, and the second scan selection unit is turned on in response to an enable signal outputted from the second control signal line; or
when the gate drive circuit operates in a reverse direction scan mode, the first scan selection unit is turned on in response to an enable signal outputted from the first control signal line, and the second scan selection unit is turned off in response to a disenable signal outputted from the second control signal line.

15. The display panel according to claim 8, wherein:
the first scan selection unit includes a first scan selection switch, wherein an input terminal of the first scan selection switch is the first scan input terminal, a control terminal of the first scan selection switch is the first scan control terminal, and an output terminal of the first scan selection switch is the first scan output terminal; and
the second scan selection unit includes a second scan selection switch, wherein an input terminal of the second scan selection switch is the second scan input terminal, a control terminal of the second scan selection switch is the second scan control terminal, and an output terminal of the second scan selection switch is the second scan output terminal.

16. The display panel according to claim 7, wherein:
one forward and reverse direction scan selection circuit is electrically connected to one pixel row correspondingly; or
the plurality of forward and reverse direction scan selection circuits is electrically connected to the plurality of sub-pixels in a one-to-one correspondence.

17. A display apparatus, comprising:
a display panel, comprising:
a gate drive circuit, comprising:
a quantity n of shift register units arranged along a first direction, wherein:
a shift register unit includes an input circuit, a first node control circuit, a second node control circuit and an output control circuit, wherein each of the input circuit, the first node control circuit and the second node control circuit is electrically connected to a third node; the first node control circuit is configured to control a stage of a first node; the second node control circuit is configured to control a stage of a second node; the output control circuit is electrically connected to each of a scan signal output terminal, the first node and the second node, and configured to control the scan signal output terminal to output a scan signal according to the stage of the first node and the stage of the second node; and
along the first direction, control terminals of an input circuit of an m-th shift register unit are electrically connected to a scan signal output terminal of an (m+1)-th shift register unit and a scan signal output terminal of an (m−1)-th shift register unit respectively, wherein m∈n;
the input circuit includes a first input selection unit and a second input selection unit; the first input selection unit includes a first input terminal, a first output terminal and a first control terminal; and the second input selection unit includes a second input terminal, a second output terminal and a second control terminal;
the first input terminal is electrically connected to a first signal line, and the first output terminal is electrically connected to the third node;
the second input terminal is electrically connected to a second signal line, and the second output terminal is electrically connected to the third node; and
along the first direction, a first control terminal of the m-th shift register unit is electrically connected to the scan signal output terminal of the (m+1)-th shift register unit; and a second control terminal of the m-th shift register unit is electrically connected to the scan signal output terminal of the (m−1)-th shift register unit; and
when the gate drive circuit operates in a forward direction scan mode, the first signal line transmits a high-level signal, and the second signal line transmits a low-level signal.

\* \* \* \* \*